(12) United States Patent
Florence et al.

(10) Patent No.: US 7,975,245 B2
(45) Date of Patent: Jul. 5, 2011

(54) COMPUTER-IMPLEMENTED METHODS FOR DETERMINING IF ACTUAL DEFECTS ARE POTENTIALLY SYSTEMATIC DEFECTS OR POTENTIALLY RANDOM DEFECTS

(75) Inventors: Glenn Florence, Pocatello, ID (US); Allen Park, San Jose, CA (US); Peter Rose, Boulder Creek, CA (US)

(73) Assignee: KLA-Tencor Corp., San Jose, CA (US)

( * ) Notice: Subject to any disclaimer, the term of this patent is extended or adjusted under 35 U.S.C. 154(b) by 383 days.

(21) Appl. No.: 12/195,024

(22) Filed: Aug. 20, 2008

(65) Prior Publication Data

US 2009/0055783 A1 Feb. 26, 2009

Related U.S. Application Data

(60) Provisional application No. 60/956,823, filed on Aug. 20, 2007.

(51) Int. Cl.
*G06F 17/50* (2006.01)

(52) U.S. Cl. ............................ 716/52; 716/112; 382/144

(58) Field of Classification Search .................... 716/52, 716/112; 382/144
See application file for complete search history.

(56) References Cited

U.S. PATENT DOCUMENTS

| | | |
|---|---|---|
| 3,495,269 A | 2/1970 | Mutschler et al. |
| 3,496,352 A | 2/1970 | Jugle |
| 3,909,602 A | 9/1975 | Micka |
| 4,015,203 A | 3/1977 | Verkuil |
| 4,247,203 A | 1/1981 | Levy et al. |
| 4,347,001 A | 8/1982 | Levy et al. |
| 4,378,159 A | 3/1983 | Galbraith |
| 4,448,532 A | 5/1984 | Joseph et al. |
| 4,532,650 A | 7/1985 | Wihl et al. |
| 4,555,798 A | 11/1985 | Broadbent, Jr. et al. |
| 4,578,810 A | 3/1986 | MacFarlane et al. |
| 4,579,455 A | 4/1986 | Levy et al. |
| 4,595,289 A | 6/1986 | Feldman et al. |
| 4,599,558 A | 7/1986 | Castellano et al. |
| 4,633,504 A | 12/1986 | Wihl |

(Continued)

FOREIGN PATENT DOCUMENTS

EP 0032197 7/1981

(Continued)

OTHER PUBLICATIONS

International Search Report for PCT/US2008/070647 mailed Dec. 16, 2008.

(Continued)

*Primary Examiner* — Naum Levin
(74) *Attorney, Agent, or Firm* — Ann Marie Mewherter

(57) ABSTRACT

Various computer-implemented methods for determining if actual defects are potentially systematic defects or potentially random defects are provided. One computer-implemented method for determining if actual defects are potentially systematic defects or potentially random defects includes comparing a number of actual defects in a group to a number of randomly generated defects in a group. The actual defects are detected on a wafer. A portion of a design on the wafer proximate a location of each of the actual defects in the group and each of the randomly generated defects in the group is substantially the same. The method also includes determining if the actual defects in the group are potentially systematic defects or potentially random defects based on results of the comparing step.

13 Claims, 5 Drawing Sheets

U.S. PATENT DOCUMENTS

| | | |
|---|---|---|
| 4,641,353 A | 2/1987 | Kobayashi |
| 4,641,967 A | 2/1987 | Pecan |
| 4,734,721 A | 3/1988 | Boyer et al. |
| 4,758,094 A | 7/1988 | Wihl |
| 4,766,324 A | 8/1988 | Saadat et al. |
| 4,799,175 A | 1/1989 | Sano et al. |
| 4,805,123 A | 2/1989 | Specht et al. |
| 4,812,756 A | 3/1989 | Curtis et al. |
| 4,814,829 A | 3/1989 | Kosugi et al. |
| 4,817,123 A | 3/1989 | Sones et al. |
| 4,845,558 A | 7/1989 | Tsai et al. |
| 4,877,326 A | 10/1989 | Chadwick et al. |
| 4,926,489 A | 5/1990 | Danielson et al. |
| 4,928,313 A | 5/1990 | Leonard et al. |
| 5,046,109 A | 9/1991 | Fujimori et al. |
| 5,124,927 A | 6/1992 | Hopewell et al. |
| 5,189,481 A | 2/1993 | Jann et al. |
| 5,355,212 A | 10/1994 | Wells et al. |
| 5,444,480 A | 8/1995 | Sumita |
| 5,453,844 A | 9/1995 | George et al. |
| 5,481,624 A | 1/1996 | Kamon |
| 5,485,091 A | 1/1996 | Verkuil |
| 5,497,381 A * | 3/1996 | O'Donoghue et al. ........ 714/745 |
| 5,528,153 A | 6/1996 | Taylor et al. |
| 5,544,256 A | 8/1996 | Brecher et al. |
| 5,563,702 A | 10/1996 | Emery et al. |
| 5,572,598 A | 11/1996 | Wihl et al. |
| 5,578,821 A | 11/1996 | Meisberger et al. |
| 5,594,247 A | 1/1997 | Verkuil et al. |
| 5,608,538 A | 3/1997 | Edger et al. |
| 5,619,548 A | 4/1997 | Koppel |
| 5,621,519 A | 4/1997 | Frost et al. |
| 5,644,223 A | 7/1997 | Verkuil |
| 5,650,731 A | 7/1997 | Fung |
| 5,661,408 A | 8/1997 | Kamieniecki et al. |
| 5,689,614 A | 11/1997 | Gronet et al. |
| 5,694,478 A | 12/1997 | Braier et al. |
| 5,696,835 A | 12/1997 | Hennessey et al. |
| 5,703,969 A | 12/1997 | Hennessey et al. |
| 5,737,072 A | 4/1998 | Emery et al. |
| 5,742,658 A | 4/1998 | Tiffin et al. |
| 5,754,678 A | 5/1998 | Hawthorne et al. |
| 5,767,691 A | 6/1998 | Verkuil |
| 5,767,693 A | 6/1998 | Verkuil |
| 5,771,317 A | 6/1998 | Edgar |
| 5,773,989 A | 6/1998 | Edelman et al. |
| 5,774,179 A | 6/1998 | Chevrette et al. |
| 5,795,685 A | 8/1998 | Liebmann et al. |
| 5,822,218 A * | 10/1998 | Moosa et al. ..................... 716/4 |
| 5,834,941 A | 11/1998 | Verkuil |
| 5,852,232 A | 12/1998 | Samsavar et al. |
| 5,866,806 A | 2/1999 | Samsavar et al. |
| 5,874,733 A | 2/1999 | Silver et al. |
| 5,884,242 A | 3/1999 | Meier et al. |
| 5,889,593 A | 3/1999 | Bareket |
| 5,917,332 A * | 6/1999 | Chen et al. ..................... 324/765 |
| 5,932,377 A | 8/1999 | Ferguson et al. |
| 5,940,458 A | 8/1999 | Suk |
| 5,948,972 A | 9/1999 | Samsavar et al. |
| 5,955,661 A | 9/1999 | Samsavar et al. |
| 5,965,306 A | 10/1999 | Mansfield et al. |
| 5,980,187 A | 11/1999 | Verhovsky |
| 5,986,263 A | 11/1999 | Hiroi et al. |
| 5,991,699 A | 11/1999 | Kulkarni et al. |
| 5,999,003 A * | 12/1999 | Steffan et al. ................. 324/537 |
| 6,011,404 A | 1/2000 | Ma et al. |
| 6,014,461 A | 1/2000 | Hennessey et al. |
| 6,040,912 A | 3/2000 | Zika et al. |
| 6,052,478 A | 4/2000 | Wihl et al. |
| 6,060,709 A | 5/2000 | Verkuil et al. |
| 6,072,320 A | 6/2000 | Verkuil |
| 6,076,465 A | 6/2000 | Vacca et al. |
| 6,078,738 A | 6/2000 | Garza et al. |
| 6,091,257 A | 7/2000 | Verkuil et al. |
| 6,091,846 A | 7/2000 | Lin et al. |
| 6,097,196 A | 8/2000 | Verkuil et al. |
| 6,097,887 A | 8/2000 | Hardikar et al. |
| 6,104,206 A | 8/2000 | Verkuil |
| 6,104,835 A | 8/2000 | Han |
| 6,117,598 A | 9/2000 | Imai |
| 6,121,783 A | 9/2000 | Horner et al. |
| 6,122,017 A | 9/2000 | Taubman |
| 6,122,046 A | 9/2000 | Almogy |
| 6,137,570 A | 10/2000 | Chuang et al. |
| 6,141,038 A | 10/2000 | Young et al. |
| 6,146,627 A | 11/2000 | Muller |
| 6,171,737 B1 | 1/2001 | Phan et al. |
| 6,175,645 B1 | 1/2001 | Elyasaf et al. |
| 6,184,929 B1 | 2/2001 | Noda et al. |
| 6,184,976 B1 | 2/2001 | Park et al. |
| 6,191,605 B1 | 2/2001 | Miller et al. |
| 6,201,999 B1 | 3/2001 | Jevtic |
| 6,202,029 B1 | 3/2001 | Verkuil et al. |
| 6,205,239 B1 | 3/2001 | Lin et al. |
| 6,224,638 B1 | 5/2001 | Jevtic et al. |
| 6,233,719 B1 | 5/2001 | Hardikar et al. |
| 6,246,787 B1 | 6/2001 | Hennessey et al. |
| 6,248,485 B1 | 6/2001 | Cuthbert |
| 6,248,486 B1 | 6/2001 | Dirksen et al. |
| 6,259,960 B1 | 7/2001 | Inokuchi |
| 6,266,437 B1 | 7/2001 | Elchel et al. |
| 6,267,005 B1 | 7/2001 | Samsavar et al. |
| 6,268,093 B1 | 7/2001 | Kenan et al. |
| 6,272,236 B1 | 8/2001 | Pierrat et al. |
| 6,282,309 B1 | 8/2001 | Emery |
| 6,292,582 B1 | 9/2001 | Lin et al. |
| 6,324,298 B1 | 11/2001 | O'Dell et al. |
| 6,344,640 B1 | 2/2002 | Rhoads |
| 6,363,166 B1 | 3/2002 | Wihl et al. |
| 6,373,975 B1 | 4/2002 | Bula et al. |
| 6,388,747 B2 * | 5/2002 | Nara et al. ..................... 356/394 |
| 6,393,602 B1 * | 5/2002 | Atchison et al. .................. 716/4 |
| 6,415,421 B2 | 7/2002 | Anderson et al. |
| 6,445,199 B1 | 9/2002 | Satya et al. |
| 6,451,690 B1 | 9/2002 | Matsumoto |
| 6,459,520 B1 | 10/2002 | Takayama |
| 6,466,314 B1 | 10/2002 | Lehman |
| 6,466,315 B1 | 10/2002 | Karpol et al. |
| 6,470,489 B1 | 10/2002 | Chang et al. |
| 6,483,938 B1 | 11/2002 | Hennessey et al. |
| 6,513,151 B1 | 1/2003 | Erhardt et al. |
| 6,526,164 B1 | 2/2003 | Mansfield et al. |
| 6,529,621 B1 | 3/2003 | Glasser et al. |
| 6,535,628 B2 | 3/2003 | Smargiassi et al. |
| 6,539,106 B1 | 3/2003 | Gallarda et al. |
| 6,569,691 B1 | 5/2003 | Jastrzebski et al. |
| 6,581,193 B1 | 6/2003 | McGhee et al. |
| 6,593,748 B1 | 7/2003 | Halliyal et al. |
| 6,597,193 B2 | 7/2003 | Lagowski et al. |
| 6,602,728 B1 | 8/2003 | Liebmann et al. |
| 6,608,681 B2 | 8/2003 | Tanaka et al. |
| 6,614,520 B1 | 9/2003 | Baraket et al. |
| 6,631,511 B2 | 10/2003 | Haffner |
| 6,636,301 B1 | 10/2003 | Kvamme et al. |
| 6,642,066 B1 | 11/2003 | Halliyal et al. |
| 6,658,640 B2 | 12/2003 | Weed |
| 6,665,065 B1 | 12/2003 | Phan et al. |
| 6,670,082 B2 | 12/2003 | Liu et al. |
| 6,680,621 B2 | 1/2004 | Savtchouk et al. |
| 6,691,052 B1 | 2/2004 | Maurer |
| 6,701,004 B1 | 3/2004 | Shykind et al. |
| 6,718,526 B1 | 4/2004 | Eldredge et al. |
| 6,721,695 B1 | 4/2004 | Chen et al. |
| 6,734,696 B2 | 5/2004 | Horner et al. |
| 6,738,954 B1 * | 5/2004 | Allen et al. ..................... 716/4 |
| 6,748,103 B2 | 6/2004 | Glasser |
| 6,751,519 B1 | 6/2004 | Satya et al. |
| 6,753,954 B2 | 6/2004 | Chen |
| 6,757,645 B2 | 6/2004 | Chang |
| 6,759,655 B2 | 7/2004 | Nara et al. |
| 6,771,806 B1 | 8/2004 | Satya et al. |
| 6,775,818 B2 | 8/2004 | Taravade et al. |
| 6,777,147 B1 | 8/2004 | Fonseca et al. |
| 6,777,676 B1 | 8/2004 | Wang et al. |
| 6,778,695 B1 | 8/2004 | Schellenberg et al. |
| 6,779,159 B2 | 8/2004 | Yokoyama et al. |
| 6,784,446 B1 | 8/2004 | Phan et al. |

| | | |
|---|---|---|
| 6,788,400 B2 | 9/2004 | Chen |
| 6,789,032 B2 | 9/2004 | Barbour et al. |
| 6,803,554 B2 | 10/2004 | Ye et al. |
| 6,806,456 B1 | 10/2004 | Ye et al. |
| 6,807,503 B2 | 10/2004 | Ye et al. |
| 6,813,572 B2 | 11/2004 | Satya et al. |
| 6,820,028 B2 | 11/2004 | Ye et al. |
| 6,828,542 B2 | 12/2004 | Ye et al. |
| 6,842,225 B1 | 1/2005 | Irie |
| 6,859,746 B1 | 2/2005 | Stirton |
| 6,879,924 B2 | 4/2005 | Ye et al. |
| 6,882,745 B2 | 4/2005 | Brankner |
| 6,884,984 B2 | 4/2005 | Ye et al. |
| 6,886,153 B1 | 4/2005 | Bevis |
| 6,892,156 B2 | 5/2005 | Ye et al. |
| 6,902,855 B2 | 6/2005 | Peterson et al. |
| 6,906,305 B2 | 6/2005 | Pease et al. |
| 6,918,101 B1 | 7/2005 | Satya et al. |
| 6,937,753 B1 | 8/2005 | O'Dell et al. |
| 6,948,141 B1 | 9/2005 | Satya et al. |
| 6,959,255 B2 | 10/2005 | Ye et al. |
| 6,966,047 B1 | 11/2005 | Glasser |
| 6,969,837 B2 | 11/2005 | Ye et al. |
| 6,969,864 B2 | 11/2005 | Ye et al. |
| 6,983,060 B1 | 1/2006 | Martinent-Catalot et al. |
| 6,988,045 B2 | 1/2006 | Purdy |
| 7,003,755 B2 | 2/2006 | Pang et al. |
| 7,003,758 B2 | 2/2006 | Ye et al. |
| 7,012,438 B1 | 3/2006 | Miller et al. |
| 7,026,615 B2 | 4/2006 | Takane |
| 7,027,143 B1 | 4/2006 | Stokowski et al. |
| 7,030,966 B2 | 4/2006 | Hansen |
| 7,030,997 B2 | 4/2006 | Neureuther et al. |
| 7,053,355 B2 | 5/2006 | Ye et al. |
| 7,061,625 B1 | 6/2006 | Hwang |
| 7,071,833 B2 | 7/2006 | Nagano et al. |
| 7,103,484 B1 | 9/2006 | Shi et al. |
| 7,106,895 B1 | 9/2006 | Goldberg et al. |
| 7,107,517 B1 | 9/2006 | Suzuki et al. |
| 7,107,571 B2 | 9/2006 | Chang et al. |
| 7,111,277 B2 | 9/2006 | Ye et al. |
| 7,114,142 B1 | 9/2006 | Hanson et al. |
| 7,114,145 B2 | 9/2006 | Ye et al. |
| 7,117,477 B2 | 10/2006 | Ye et al. |
| 7,117,478 B2 | 10/2006 | Ye et al. |
| 7,120,285 B1 | 10/2006 | Spence |
| 7,120,895 B2 | 10/2006 | Ye et al. |
| 7,123,356 B1 | 10/2006 | Stokowski |
| 7,124,386 B2 | 10/2006 | Smith |
| 7,133,548 B2 | 11/2006 | Kenan et al. |
| 7,135,344 B2 | 11/2006 | Nehmadi |
| 7,136,143 B2 | 11/2006 | Smith |
| 7,152,215 B2 | 12/2006 | Smith |
| 7,162,071 B2 | 1/2007 | Hung et al. |
| 7,171,334 B2 | 1/2007 | Gassner |
| 7,174,520 B2 | 2/2007 | White |
| 7,194,709 B2 | 3/2007 | Brankner |
| 7,207,017 B1 | 4/2007 | Tabery et al. |
| 7,231,628 B2 | 6/2007 | Pack et al. |
| 7,236,847 B2 | 6/2007 | Marella |
| 7,379,175 B1 | 5/2008 | Stokowski et al. |
| 7,383,156 B2 | 6/2008 | Matsusita et al. |
| 7,386,839 B1 | 6/2008 | Golender et al. |
| 7,418,124 B2 | 8/2008 | Peterson et al. |
| 7,424,145 B2 | 9/2008 | Horie et al. |
| 7,676,077 B2 * | 3/2010 | Kulkarni et al. ............ 382/144 |
| 7,739,064 B1 | 6/2010 | Ryker et al. |
| 2001/0019625 A1 | 9/2001 | Kenan et al. |
| 2001/0022858 A1 | 9/2001 | Komiya et al. |
| 2001/0043735 A1 | 11/2001 | Smargiassi et al. |
| 2002/0019729 A1 | 2/2002 | Chang et al. |
| 2002/0026626 A1 | 2/2002 | Randall et al. |
| 2002/0033449 A1 | 3/2002 | Nakasuji et al. |
| 2002/0035461 A1 | 3/2002 | Chang et al. |
| 2002/0035641 A1 | 3/2002 | Kurose |
| 2002/0088951 A1 | 7/2002 | Chen |
| 2002/0090746 A1 | 7/2002 | Xu et al. |
| 2002/0134936 A1 | 9/2002 | Matsui et al. |
| 2002/0144230 A1 | 10/2002 | Rittman |
| 2002/0164065 A1 | 11/2002 | Cai et al. |
| 2002/0176096 A1 | 11/2002 | Sentoku et al. |
| 2002/0181756 A1 | 12/2002 | Shibuya et al. |
| 2002/0186878 A1 | 12/2002 | Hoon et al. |
| 2002/0192578 A1 | 12/2002 | Tanaka et al. |
| 2003/0014146 A1 | 1/2003 | Fujii |
| 2003/0017664 A1 | 1/2003 | Pnueli et al. |
| 2003/0022401 A1 | 1/2003 | Hamamatsu et al. |
| 2003/0033046 A1 | 2/2003 | Yoshitake et al. |
| 2003/0048458 A1 | 3/2003 | Mieher |
| 2003/0048939 A1 | 3/2003 | Lehman |
| 2003/0057971 A1 | 3/2003 | Nishiyama et al. |
| 2003/0086081 A1 | 5/2003 | Lehman |
| 2003/0094572 A1 | 5/2003 | Matsui et al. |
| 2003/0098805 A1 | 5/2003 | Bizjak |
| 2003/0128870 A1 | 7/2003 | Pease et al. |
| 2003/0138138 A1 | 7/2003 | Vacca et al. |
| 2003/0138978 A1 | 7/2003 | Tanaka et al. |
| 2003/0169916 A1 | 9/2003 | Hayashi et al. |
| 2003/0192015 A1 | 10/2003 | Liu |
| 2003/0207475 A1 | 11/2003 | Nakasuji et al. |
| 2003/0223639 A1 | 12/2003 | Shlain et al. |
| 2003/0226951 A1 | 12/2003 | Ye et al. |
| 2003/0228714 A1 | 12/2003 | Smith |
| 2003/0229410 A1 | 12/2003 | Smith |
| 2003/0229412 A1 | 12/2003 | White |
| 2003/0229868 A1 | 12/2003 | White |
| 2003/0229875 A1 | 12/2003 | Smith |
| 2003/0229880 A1 | 12/2003 | White |
| 2003/0229881 A1 | 12/2003 | White |
| 2003/0237064 A1 | 12/2003 | White et al. |
| 2004/0030430 A1 | 2/2004 | Matsuoka |
| 2004/0032908 A1 | 2/2004 | Hagai et al. |
| 2004/0049722 A1 | 3/2004 | Matsushita et al. |
| 2004/0052411 A1 | 3/2004 | Qian et al. |
| 2004/0057611 A1 | 3/2004 | Lee |
| 2004/0091142 A1 | 5/2004 | Peterson et al. |
| 2004/0094762 A1 * | 5/2004 | Hess et al. ............ 257/48 |
| 2004/0098216 A1 | 5/2004 | Ye et al. |
| 2004/0102934 A1 | 5/2004 | Chang |
| 2004/0107412 A1 | 6/2004 | Pack et al. |
| 2004/0119036 A1 | 6/2004 | Ye et al. |
| 2004/0120569 A1 | 6/2004 | Hung et al. |
| 2004/0133369 A1 | 7/2004 | Pack et al. |
| 2004/0174506 A1 | 9/2004 | Smith |
| 2004/0223639 A1 | 11/2004 | Sato et al. |
| 2004/0228515 A1 | 11/2004 | Okabe et al. |
| 2004/0234120 A1 * | 11/2004 | Honda et al. ............ 382/145 |
| 2004/0243320 A1 | 12/2004 | Chang et al. |
| 2004/0254752 A1 | 12/2004 | Wisniewski et al. |
| 2005/0004774 A1 | 1/2005 | Volk et al. |
| 2005/0008218 A1 | 1/2005 | O'Dell et al. |
| 2005/0010890 A1 | 1/2005 | Nehmadi et al. |
| 2005/0062962 A1 | 3/2005 | Fairley |
| 2005/0117796 A1 | 6/2005 | Matsui |
| 2005/0132306 A1 | 6/2005 | Smith |
| 2005/0141764 A1 | 6/2005 | Tohyama et al. |
| 2005/0166174 A1 | 7/2005 | Ye et al. |
| 2005/0184252 A1 | 8/2005 | Ogawa et al. |
| 2005/0190957 A1 | 9/2005 | Cai et al. |
| 2005/0198602 A1 | 9/2005 | Brankner |
| 2006/0000964 A1 | 1/2006 | Ye et al. |
| 2006/0048089 A1 | 3/2006 | Schwarzbaned |
| 2006/0051682 A1 | 3/2006 | Hess et al. |
| 2006/0062445 A1 | 3/2006 | Verma et al. |
| 2006/0082763 A1 | 4/2006 | The et al. |
| 2006/0159333 A1 | 7/2006 | Ishikawa |
| 2006/0161452 A1 | 7/2006 | Hess |
| 2006/0193506 A1 | 8/2006 | Dorphan et al. |
| 2006/0193507 A1 | 8/2006 | Sali et al. |
| 2006/0236294 A1 | 10/2006 | Saidin |
| 2006/0236297 A1 | 10/2006 | Melvin et al. |
| 2006/0239536 A1 | 10/2006 | Shibuya |
| 2006/0265145 A1 | 11/2006 | Huet et al. |
| 2006/0266243 A1 | 11/2006 | Percin et al. |
| 2006/0269120 A1 * | 11/2006 | Nehmadi et al. ............ 382/145 |
| 2006/0273242 A1 | 12/2006 | Hunsche et al. |
| 2006/0273266 A1 | 12/2006 | Preil et al. |
| 2006/0291714 A1 | 12/2006 | Wu et al. |

| | | | |
|---|---|---|---|
| 2006/0292463 | A1 | 12/2006 | Best et al. |
| 2007/0002322 | A1 | 1/2007 | Borodovsky et al. |
| 2007/0019171 | A1 | 1/2007 | Smith |
| 2007/0031745 | A1 | 2/2007 | Ye et al. |
| 2007/0032896 | A1 | 2/2007 | Ye et al. |
| 2007/0035322 | A1 | 2/2007 | Kang et al. |
| 2007/0035712 | A1 | 2/2007 | Gassner et al. |
| 2007/0035728 | A1 | 2/2007 | Kekare et al. |
| 2007/0052963 | A1* | 3/2007 | Orbon et al. .................. 356/430 |
| 2007/0064995 | A1 | 3/2007 | Oaki et al. |
| 2007/0133860 | A1 | 6/2007 | Lin |
| 2007/0156379 | A1* | 7/2007 | Kulkarni et al. ................. 703/14 |
| 2007/0230770 | A1 | 10/2007 | Kulkarni et al. |
| 2007/0248257 | A1 | 10/2007 | Bruce et al. |
| 2007/0280527 | A1 | 12/2007 | Almogy et al. |
| 2007/0288219 | A1 | 12/2007 | Zafar et al. |
| 2008/0013083 | A1 | 1/2008 | Kirk et al. |
| 2008/0049994 | A1 | 2/2008 | Rognin et al. |
| 2008/0072207 | A1 | 3/2008 | Verma et al. |
| 2008/0163140 | A1* | 7/2008 | Fouquet et al. .................... 716/4 |
| 2008/0167829 | A1 | 7/2008 | Park et al. |
| 2008/0250384 | A1* | 10/2008 | Duffy et al. ...................... 716/21 |
| 2008/0295047 | A1* | 11/2008 | Nehmadi et al. .................. 716/4 |
| 2009/0210183 | A1* | 8/2009 | Rajski et al. ..................... 702/84 |

FOREIGN PATENT DOCUMENTS

| | | |
|---|---|---|
| EP | 0370322 | 5/1990 |
| EP | 1061358 | 12/2000 |
| EP | 1061571 | 12/2000 |
| EP | 1065567 | 1/2001 |
| EP | 1066925 | 1/2001 |
| EP | 1069609 | 1/2001 |
| EP | 1093017 | 4/2001 |
| EP | 1480034 | 11/2004 |
| EP | 1696270 | 8/2006 |
| JP | 2002-071575 | 3/2002 |
| JP | 2002-365235 | 12/2002 |
| JP | 2004-045066 | 2/2004 |
| KR | 1020030055848 | 7/2003 |
| KR | 1020050092053 | 9/2005 |
| WO | WO 98/57358 | 12/1998 |
| WO | WO 99/22310 | 5/1999 |
| WO | WO 99/25004 | 5/1999 |
| WO | WO 99/38002 | 7/1999 |
| WO | WO 99/41434 | 8/1999 |
| WO | WO 99/59200 | 11/1999 |
| WO | WO 00/03234 | 1/2000 |
| WO | WO 00/36525 | 6/2000 |
| WO | WO 00/55799 | 9/2000 |
| WO | WO 00/68884 | 11/2000 |
| WO | WO 00/70332 | 11/2000 |
| WO | WO 01/09566 | 2/2001 |
| WO | WO 01/40145 | 6/2001 |
| WO | WO 03/104921 | 12/2003 |
| WO | WO 2004/027684 | 4/2004 |
| WO | WO 2006/063268 | 6/2006 |

OTHER PUBLICATIONS

International Search Report and Written Opinion for PCT/US2008/073706 mailed Jan. 29, 2009.

International Search Report and Written Opinion for PCT/US2008/072636 mailed Jan. 29, 2009.

International Search Report and Written Opinion for PCT Appln. No. PCT/US06/61112 dated Sep. 25, 2008.

Cai et al., "Enhanced Dispositioning of Reticle Defects Using the Virtual Stepper With Automoated Defect Severity Scoring," Proceedings of the SPIE, vol. 4409, Jan. 2001, pp. 467-478.

Hess et al., "A Novel Approach: High Resolution Inspection with Wafer Plane Defect Detection," Proceedings of SPIE—International Society for Optical Engineering; Photomask and Next-Generation Lithography Mask Technology 2008, vol. 7028, 2008.

Huang et al., "Process Window Impact of Progressive Mask Defects, Its Inspection and Disposition Techniques (go/no-go criteria) Via a Lithographic Detector," Proceedings of SPIE—The International Society for Optical Engineering; 25th Annual Bacus Symposium on Photomask Technology 2005, vol. 5992, No. 1, 2005, p. 6.

International Search Report and Written Opinion for PCT Appln. No. PCT/US06/61112 dated Sep. 25, 2008.

International Search Report and Written Opinion for PCT/US2008/062873 mailed Aug. 12, 2008.

International Search Report for PCT/US2008/62875 mailed Sep. 10, 2008.

Karklin et al., "Automatic Defect Severity Scoring for 193 nm Reticle Defect Inspection," Proceedings of SPIE—The International Society for Optical Engineering, 2001, vol. 4346, No. 2, pp. 898-906.

Nagpal et al., "Wafer Plane Inspection for Advanced Reticle Defects," Proceedings of SPIE—The International Society for Optical Engineering; Photomask and Next-Generation Lithography Mask Technology, vol. 7028, 2008.

Pettibone et al., "Wafer Printability Simulation Accuracy Based on UV Optical Inspection Images of Reticle Defects," Proceedings of SPIE—The International Society for Optical Engineering 1999 Society of Photo-Optical Instrumentation Engineers, vol. 3677, No. II, 1999, pp. 711-720.

Phan et al., "Comparison of Binary Mask Defect Printability Analysis Using Virtual Stepper System and Aerial Image Microscope System," Proceedings of SPIE—The International Society for Optical Engineering 1999 Society of Photo-Optical Instrumentation Engineers, vol. 3873, 1999, pp. 681-692.

U.S. Appl. No. 12/115,833 (Alles et al.) entitled Methods for Detecting and Classifying Defects on a Reticle filed May 6, 2008.

U.S. Appl. No. 60/681,095 (Nehmadi et al.) entitled Methods in Mask and Process Qualification filed May 13, 2005.

U.S. Appl. No. 60/684,360 (Nehmadi et al.) entitled Design-Based Inspection filed May 24, 2005.

Allan et al., "Critical Area Extraction for Soft Fault Estimation," IEEE Transactions on Semiconductor Manufacturing, vol. 11, No. 1, Feb. 1998.

Barty et al., "Aerial Image Microscopes for the inspection of defects in EUV masks," Proceedings of SPIE, vol. 4889, 2002, pp. 1073-1084.

Budd et al., "A New Mask Evaluation Tool, the Microlithography Simulation Microscope Aerial Image Measurement System," SPIE vol. 2197, 1994, pp. 530-540.

Comizzoli, "Uses of Corona Discharges in the Semiconfuctor Industry," J. Electrochem. Soc., 1987, pp. 424-429.

Contactless Electrical Equivalent Oxide Thickness Measurement, IBM Technical Disclosure Bulletin, vol. 29, No. 10, 1987, pp. 4622-4623.

Contactless Photovoltage vs. Bias Method for Determining Flat-Band Voltage, IBM Technical Disclosure Bulletin, vol. 32, vol. 9A, 1990, pp. 14-17.

Cosway et al., "Manufacturing Implementation of Corona Oxide Silicon (COS) Systems for Diffusion Furnace Contamination Monitoring," 1997 IEEE/SEMI Advanced Semiconductor Manufacturing Conference, pp. 98-102.

Diebold et al., "Characterization and produiction metrology of thin transistor gate oxide films," Materials Science in Semiconductor Processing 2, 1999, pp. 103-147.

Dirksen et al., "Impact of high order aberrations on the performance of the aberration monitor," Proc. of SPIE vol. 4000, Mar. 2000, pp. 9-17.

Dirksen et al., "Novel aberration monitor for optical lithography," Proc. of SPIE vol. 3679, Jul. 1999, pp. 77-86.

Garcia et al., "New Die to Database Inspection Algorithm for Inspection of 90-nm Node Reticles," Proceedings of SPIE, vol. 5130, 2003, pp. 364-374.

Granik et al., "Sub-resolution process windows and yield estimation technique based on detailed full-chip CD simulation," Mentor Graphics, Sep. 2000, 5 pages.

Hung et al., Metrology Study of Sub 20 Angstrom oxynitride by Corona-Oxide-Silicon (COS) and Conventional C-V Approaches, 2002, Mat. Res, Soc. Symp. Proc., vol. 716, pp. 119-124.

International Search Report and Written Opinion for PCT Appln. No. PCT/US06/61113 dated Jul. 16, 2008.

International Search Report and Written Opinion for PCT Appln. No. PCT/US08/050397 dated Jul. 11, 2008.

International Search Report and Written Opinion for PCT Appln. No. PCT/US2008/063008 dated Aug. 18, 2008.

International Search Report for PCT/US2003/21907 mailed Jun. 7, 2004.
International Search Report for PCT/US2004/040733 mailed Dec. 23, 2005.
Lo et al., "Identifying Process Window Marginalities of Reticle Designs for 0.15/0.13 µm Technologies," Proceedings of SPIE vol. 5130, 2003, pp. 829-837.
Lorusso et al. "Advanced DFM Applns. Using design-based metrology on CDSEM," SPIE vol. 6152, Mar. 27, 2006.
Lu et al., "Application of Simulation Based Defect Printability Analysis for Mask Qualification Control," Proceedings of SPIE, vol. 5038, 2003, pp. 33-40.
Mack, "Lithographic Simulation: A Review," Proceedings of SPIE vol. 4440, 2001, pp. 59-72.
Martino et al., "Application of the Aerial Image Measurement System (AIMS(TM)) to the Analysis of Binary Mask Imaging and Resolution Enhancement Techniques," SPIE vol. 2197, 1994, pp. 573-584.
Miller, "A New Approach for Measuring Oxide Thickness," Semiconductor International, Jul. 1995, pp. 147-148.
Numerical Recipes in C. The Art of Scientific Computing, 2nd Ed., © Cambridge University Press 1988. 1992, p. 683.
Otsu, "A Threshold Selection Method from Gray-Level Histograms," IEEE Transactions on Systems, Man, and Cybernetics, vol. SMC-9, No. 1, Jan. 1979, pp. 62-66.
Pang et al., "Simulation-based Defect Printability Analysis on Alternating Phase Shifting Masks for 193 nm Lithography," Proceedings of SPIE, vol. 4889, 2002, pp. 947-954.
Sahouria et al., "Full-chip Process Simulation for Silicon DRC," Mentor Graphics, Mar. 2000, 6 pages.
Schroder et al., Corono-Oxide-Semiconductor Device Characterization, 1998, Solid-State Electronics, vol. 42, No. 4, pp. 505-512.
Schroder, "Surface voltage and surface photovoltage: history, theory and applications," Measurement Science and Technology, vol. 12, 2001, pp. R16-R31.
Schroder, Contactless Surface Charge Semiconductor Characterization, Apr. 2002, Materials Science and Engineering B, vol. 91-92, pp. 196-228.
Schurz et al., "Simulation Study of Reticle Enhancement Technology Applications for 157 nm Lithography," SPIE vol. 4562, 2002, pp. 902-913.
Svidenko et al. "Dynamic Defect-Limited Yield Prediction by Criticality Factor," ISSM Paper: YE-O-157, 2007.
U.S. Appl. No. 10/677,445 (Horner et al.) entitled Methods for Non-Contacting Differential Voltage Measurements filed Oct. 2, 2003.
U.S. Appl. No. 10/778,752 (Mack et al.) entitled Methods for Improved Monitor and Control of Lithography Processes filed Feb. 13, 2004.
U.S. Appl. No. 11/154,310 (Verma et al.) entitled Computer-Implemented Methods, Simulation Engines and Systems for filed Jun. 16, 2005.
U.S. Appl. No. 11/830,485 (Kulkarni et al.) entitled Semiconductor Device Property Extraction, Generation, Visualization, and Monitoring Methods filed Jul. 30, 2007.
U.S. Appl. No. 11/837,208 (Park et al.) entitled Computer-Implemented Methods, Carrier Media, and Systems for Generating a Metrology Sampling Plan filed Aug. 10, 2007.
U.S. Appl. No. 11/960,157 (Duffy et al.) entitled Systems and Methodsfor Creating Inspection Recipes filed Dec. 19, 2007.
U.S. Appl. No. 12/102,343 (Chen et al.) entitled Methods and Systems for Determining a Defect Criticality Index for Defects on Wafers filed Apr. 14, 2008.
U.S. Appl. No. 12/115,830 (Su et al.) entitled Computer-Implemented Methods, Systems, and Computer-Readable Media for Determining a Model for Predicting Printability of Reticle Features on a Wafer filed May 6, 2008.

U.S. Appl. No. 12/115,833 (Alles et al.) entitled Methods for Detecting and Classifying Defects on a Reticle filed May 6, 2008.
U.S. Appl. No. 12/116,664 (Peterson et al.) entitled Methods and Systems for Detecting Defects in a Reticle Design Pattern filed May 7, 2008.
U.S. Appl. No. 12/176,095 (Bhaskar et al.) entitled Methods for Generating a Standard Reference Die for Use in a Die to Standard Reference Die Inspection and Methods for Inspecting a Wafer filed Jul. 18, 2008.
U.S. Appl. No. 60/418,887 (Su et al.) entitled Methods and Systems for Inspecting Reticles Using Aerial Imaging and Die-to-Database Detection filed Oct. 15, 2002.
U.S. Appl. No. 60/418,994 (Stokowski et al.) entitled Methods and Systems for Reticle Inspection and Defect Review Using Aerial Imaging filed Oct. 15, 2002.
U.S. Appl. No. 60/419,028 (Stokowski et al.) entitled Methods and Systems for Inspecting Reticles Using Aerial Imaging at Off-Stepper Wavelengths filed Oct. 15, 2002.
U.S. Appl. No. 60/451,707 (Howard et al.) entitled Methods and Systems for Classifying and Analyzing Defects on Reticles filed Mar. 4, 2003.
U.S. Appl. No. 60/526,881 (Hess et al.) entitled Designer Intent filed Dec. 4, 2003.
U.S. Appl. No. 60/609,670 (Preil et al.) entitled Methods, Systems, and Carrier Media for Evaluating Reticle Layout Data filed Sep. 14, 2004.
U.S. Appl. No. 60/738,290 (Kulkarni et al.) entitled Methods and Systems for Utilizing Design Data in Combination With Inspection Data filed Nov. 18, 2005.
U.S. Appl. No. 60/772,418 (Kirk et al.) entitled Methods and Systems for Determining a Characteristic of a Wafer filed Feb. 9, 2006.
Verkuil et al., "A Contactless Alternative to MOS Charge Measurements by Means of a Corona-Oxide-Semiconductor (COS) Technique,"Electrochem. Soc. Extended Abstracts, 1988, vol. 88-1, No. 169, pp. 261-262.
Verkuil, "Rapid Contactless Method for Measuring Fixed Oxide Charge ASsociated with Silicon Processing," IBM Technical Disclousre Bulletin, vol. 24, No. 6, 1981, pp. 3048-3053.
Volk et al. "Investigation of Reticle Defect Formation at DUV Lithography," 2002, BACUS Symposium on Photomask Technology.
Volk et al. "Investigation of Reticle Defect Formation at DUV Lithography," 2003, IEEE/SEMI Advanced Manufacturing Conference, pp. 29-35.
Volk et al., "Investigation of Smart Inspection of Critical Layer Reticles using Additional Designer Data to Determine Defect Significance," Proceeings of SPIE vol. 5256, 2003, pp. 489-499.
Weinberg, "Tunneling of Electrons from Si into Thermally Grown SiO2," Solid-State Electronics, 1977, vol. 20, pp. 11-18.
Weinzierl et al., "Non-Contact Corona-Based Process Control Measurements: Where We've Been, Where We're Headed," Electrochemical Society Proceedings, Oct. 1999, vol. 99-16, pp. 342-350.
Yan et al., "Printability of Pellicle Defects in DUV 0.5 um Lithography," SPIE vol. 1604, 1991, pp. 106-117.
International Search Report & Written Opinion, PCT/US2008/066328, mailed Oct. 1, 2009.
O'Gorman et al., "Subpixel Registration Using a Concentric Ring Fiducial," Proceedings of the International Conference on Pattern Recognition, vol. ii, Jun. 16, 1990, pp. 249-253.
Written Opinion for Singapore Patent Application No. 201000407-5 mailed Mar. 24, 2011.

* cited by examiner

COMPUTER-IMPLEMENTED METHODS FOR DETERMINING IF ACTUAL DEFECTS ARE POTENTIALLY SYSTEMATIC DEFECTS OR POTENTIALLY RANDOM DEFECTS

PRIORITY CLAIM

This application claims priority to U.S. Provisional Application Nos. 60/956,823 entitled "Computer-Implemented Methods for Determining if Actual Defects are Systematic Defects or Random Defects," filed Aug. 20, 2007, which is incorporated by reference as if fully set forth herein.

BACKGROUND OF THE INVENTION

1. Field of the Invention

The present invention generally relates to computer-implemented methods for determining if actual defects are potentially systematic defects or potentially random defects. Certain embodiments relate to determining if actual defects are potentially systematic defects or potentially random defects by comparing actual defects grouped by design to randomly generated defects grouped by design.

2. Description of the Related Art

The following description and examples are not admitted to be prior art by virtue of their inclusion in this section.

An integrated circuit (IC) design may be developed using a method or system such as electronic design automation (FDA), computer aided design (CAD), and other IC design software. Such methods and systems may also be used to generate a circuit pattern database from the IC design. The circuit pattern database includes data representing a plurality of layouts for various layers of the IC. Data in the circuit pattern database may, therefore, be used to determine layouts for a plurality of reticles. A layout of a reticle generally includes polygons that define features in a pattern on the reticle. Each reticle is used to fabricate one of the various layers of the IC. The layers of the IC may include, for example, a junction pattern in a semiconductor substrate, a gate dielectric pattern, a gate electrode pattern, a contact pattern in an interlevel dielectric, and an interconnect pattern on a metallization layer.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on wafers to promote higher yield in the manufacturing process and thus higher profits. Inspection has always been an important part of fabricating semiconductor devices such as ICs. However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary since even relatively small defects may cause unwanted aberrations in the semiconductor devices.

As design rules shrink, however, semiconductor manufacturing processes may be operating closer to the limitations on the performance capability of the processes. In addition, smaller defects can have an impact on the electrical parameters of the device as the design rules shrink, which drives more sensitive inspections. Therefore, as design rules shrink, the population of potentially yield relevant defects detected by inspection grows dramatically. As a result, more and more defects may be detected on the wafers, and correcting the processes to eliminate all of the defects may be difficult and expensive. As such, determining which of the defects actually have an effect on the electrical parameters of the devices and the yield may allow process control methods to be focused on those defects while largely ignoring others. Furthermore, at smaller design rules, process induced failures may, in some cases, tend to be systematic. That is, process induced failures tend to fail at predetermined design patterns often repeated many times within the design. In addition, although defects are generally related to process and design interaction, process induced failures are defects that are created from the artifacts of process variation not necessarily due to weak design and process variations. Systematic defects are structurally repeating defects that still may be distributed at random locations spatially. Elimination of systematic, electrically relevant defects is important because eliminating such defects can have a significant overall impact on yield.

One currently used method for separating systematic and random defects uses repeater analysis. Another method for separating systematic and random defects relies upon a user-defined horizontal cut-line (or threshold) applied to a Pareto chart illustrating defects grouped by similarity between design clips. Groups that include a number of defects higher than this cut-line are defined to be potential systematic defects although, in general, systematic defects are not identified based on defect count alone. In particular, review of potential systematic defects is generally performed. However, such methods have a number of disadvantages. For example, such previously used methods require user intervention and judgment to determine the threshold. In addition, random defect groups are known to often have higher defect counts than defect counts of systematic defect groups. As such, these previously used methods may produce incorrect results by identifying groups of random defects as potential systematic defects. In addition, the Pareto chart cut-line based methods may not be effective for determining which defect bins include potentially systematic defects since, if it is assumed that all defects on a given wafer are random defects (i.e., a 0% systematic assumption), then the defect counts shown in a Pareto chart illustrating the results of design based grouping may report only the relative area of different circuit structures on the wafer.

Accordingly, it may be advantageous to develop computer-implemented methods for determining if defects are potentially systematic defects or potentially random defects, which can be performed without user intervention and judgment and have higher accuracy than currently used methods for differentiating between potentially systematic defects and potentially random defects.

SUMMARY OF THE INVENTION

The following description of various embodiments of computer-implemented methods is not to be construed in any way as limiting the subject matter of the appended claims.

One embodiment relates to a computer-implemented method for determining if actual defects are potentially systematic defects or potentially random defects. The method includes comparing a number of actual defects in a group to a number of randomly generated defects in a group. The actual defects are detected on a wafer. A portion of a design on the wafer proximate a location of each of the actual defects in the group and each of the randomly generated defects in the group is substantially the same. The method also includes determining if the actual defects in the group are potentially systematic defects or potentially random defects based on results of the comparing step.

In one embodiment, the comparing step includes comparing a Pareto chart generated for the actual defects to a Pareto chart generated for the randomly generated defects. In another embodiment, the comparing step includes determining a ratio of the number of the actual defects in the group to the number of the randomly generated defects in the group.

In one embodiment, the portion of the design corresponds to a design clip. In another embodiment, the method is performed separately for different groups of actual defects detected on the wafer. In one such embodiment, a portion of the design on the wafer proximate a location of each of the actual defects in each of the different groups is substantially the same. In another embodiment, the method is performed separately for all groups of actual defects detected on the wafer. In one such embodiment, a portion of the design on the wafer proximate a location of each of the actual defects in each of all of the groups is substantially the same.

In one embodiment, the method is performed without user intervention. In some embodiments, the actual defects are detected by inspection of a layer on the wafer, and the randomly generated defects are generated once for an inspection recipe for the layer on the wafer and used for performing the method for defects detected on the layer of multiple wafers using the inspection recipe.

In one embodiment, the determining step includes determining that the actual defects in the group are potentially systematic defects if the number of the actual defects in the group is greater than the number of the randomly generated defects in the group and determining that the actual defects in the group are potentially random defects if the number of the actual defects in the group is not greater than the number of the randomly generated defects in the group.

In another embodiment, the determining step includes determining that the actual defects in the group are potentially systematic defects if the number of the actual defects in the group is statistically greater than the number of the randomly generated defects in the group and determining that the actual defects in the group are potentially random defects if the number of the actual defects in the group is not statistically greater than the number of the randomly generated defects in the group.

In one embodiment, prior to the comparing step, the method includes normalizing the number of the randomly generated defects in the group to the number of the actual defects in the group based on total number of the actual defects detected on the wafer and total number of the randomly generated defects.

In another embodiment, the method includes comparing the number of the actual defects in the group to a number of different randomly generated defects in a different group. A portion of the design proximate the location of each of the actual defects in the group and a location of each of the different randomly generated defects in the different group is substantially the same. The randomly generated defects and the different randomly generated defects are separately generated. In some such embodiments, the determining step includes determining if the actual defects in the group are potentially systematic defects or potentially random defects based on the results of comparing the number of the actual defects in the group to the number of the randomly generated defects in the group and the number of the different randomly generated defects in the group.

Each of the steps of the method described above may be further performed as described herein. In addition, each of the embodiments of the method described above may include any other step(s) of any other method(s) described herein. Furthermore, each of the embodiments of the method described above may be performed by any of the systems described herein.

Another embodiment relates to a computer-implemented method for creating a set of groups of randomly generated defects for use in determining if groups of actual defects are potentially systematic defects or potentially random defects. The method includes randomly generating a set of defects at different locations across an area corresponding to an inspected area of at least a portion of a wafer. The method also includes binning the set of randomly generated defects into groups such that a portion of a design on the wafer proximate locations of the randomly generated defects in each of the groups is substantially the same. In addition, the method includes determining a number of the randomly generated defects in each of the groups. The numbers of the randomly generated defects in the groups can be compared to numbers of actual defects in corresponding groups to determine if the actual defects in the corresponding groups are potentially systematic defects or potentially random defects.

In one embodiment, the method is performed more than once to determine additional numbers for a different set of randomly generated defects. In one such embodiment, the numbers and the additional numbers can be compared to the numbers of the actual defects in the corresponding groups to determine if the actual defects in the corresponding groups are potentially systematic defects or potentially random defects. In another such embodiment, the method includes using the additional numbers to validate the randomly generating step.

In one embodiment, randomly generating the set of defects includes randomly generating the set of defects using stochastic simulation. In another embodiment, randomly generating the set of defects includes randomly generating the defects at locations arranged in a grid across the area. In an additional embodiment, randomly generating the set of defects includes randomly generating the defects at locations having a substantially uniform distribution across the area. In a further embodiment, randomly generating the set of defects is performed such that a frequency of the randomly generated defects in each of the groups is approximately equal to a frequency of the portion of the design proximate the locations of the randomly generated defects in each of the groups across the area.

In one embodiment, the inspected area of at least the portion of the wafer is approximately equal to an inspected area of a die on the wafer. In another embodiment, the method includes generating a Pareto chart for the set of randomly generated defects. In one such embodiment, the numbers of the randomly generated defects can be compared to the numbers of the actual defects in the corresponding groups by comparing the Pareto chart for the set of the randomly generated defects to a Pareto chart for the actual defects.

Each of the steps of the method described above may be further performed as described herein. In addition, each of the embodiments of the method described above may include any other step(s) of any other method(s) described herein. Furthermore, each of the embodiments of the method described above may be performed by any of the systems described herein.

An additional embodiment relates to a computer-implemented method for creating a normalized set of groups of randomly generated defects for use in determining if corresponding groups of actual defects are potentially systematic defects or potentially random defects. The method includes determining a total number of all actual defects detected on a layer of a wafer. The method also includes normalizing numbers of randomly generated defects in groups to numbers of the actual defects in corresponding groups based on the total number of all of the actual defects detected on the wafer. A portion of a design on the wafer proximate locations of the randomly generated defects in each of the groups is substantially the same. The normalized numbers of the randomly generated defects in the groups can be compared to numbers of the actual defects in the corresponding groups to determine if the corresponding groups of the actual defects are potentially systematic defects or potentially random defects.

Each of the steps of the method described above may be further performed as described herein. In addition, the embodiment of the method described above may include any other step(s) of any other method(s) described herein. Furthermore, the embodiment of the method described above may be performed by any of the systems described herein.

BRIEF DESCRIPTION OF THE DRAWINGS

Further advantages of the present invention may become apparent to those skilled in the art with the benefit of the following detailed description of the preferred embodiments and upon reference to the accompanying drawings in which.

Figure 2:
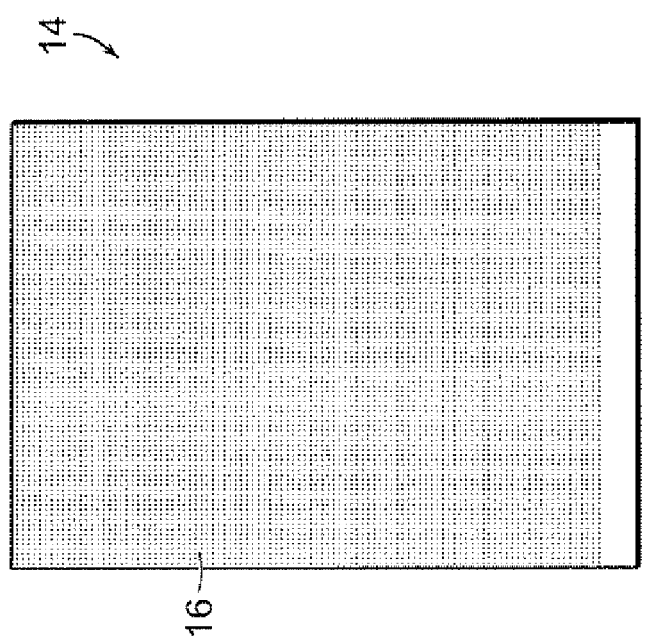
FIG. 2 is a die map illustrating one example of results of one embodiment of randomly generating a set of defects at different locations across an area corresponding to an inspected area of at least a portion of a wafer.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

As used herein, the term "actual defects" refers to actual defects detected on a wafer. Therefore, the term "actual defects" does not refer to actual defects that may be present on a wafer but have not been detected on the wafer.

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

A wafer may include one or more layers formed upon a substrate. For example, such layers may include, but are not limited to, a resist, a dielectric material, a conductive material, and a semiconductive material. Many different types of such layers are known in the art, and the term wafer as used herein is intended to encompass a wafer including all types of such layers.

One or more layers formed on a wafer may be patterned or unpatterned. For example, a wafer may include a plurality of dies, each having repeatable patterned features. Formation and processing of such layers of material may ultimately result in completed devices. Many different types of devices such as integrated circuits (ICs) may be formed on a wafer, and the term wafer as used herein is intended to encompass a wafer on which any type of device known in the art is being fabricated.

Although embodiments are described herein with respect to wafers, it is to be understood that the embodiments may be used for another specimen such as a reticle, which may also be commonly referred to as a mask or a photomask. Many different types of reticles are known in the art, and the terms "reticle," "mask," and "photomask" as used herein are intended to encompass all types of reticles known in the art.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals.

In general, the embodiments described herein relate to differentiating between potentially systematic defects and potentially random defects. "Potentially systematic defects" are defined herein as actual defects in a group of defects (or a bin) that is likely to contain systematic defects as opposed to random defects (although whether or not the group contains systematic defects may be confirmed or determined more definitely using one or more other methods (e.g., defect review)). "Potentially random defects" are defined herein as actual defects in a group (or a bin) that is likely to contain random defects as opposed to systematic defects (although whether or not the group contains random defects may be confirmed or determined in a more definite manner using one or more other methods (e.g., defect review)).

One embodiment relates to a computer-implemented method for creating a set of groups of randomly generated defects for use in determining if groups of actual defects are potentially systematic defects or potentially random defects. The actual defects are defects detected on a wafer. In particular, the actual defects may be detected on a patterned wafer such that the defects can be grouped based on design as described further herein. The set of groups of randomly generated defects may be used to determine if groups of actual defects are potentially systematic defects or potentially random defects as described further herein. In particular, the set of groups of randomly generated defects may be used in embodiments of methods for determining if actual defects are potentially systematic defects or potentially random defects described further herein.

The method includes randomly generating a set of defects at different locations across an area corresponding to an inspected area of at least a portion of a wafer. For example, the set of defects may be randomly generated on the design representing the inspected portion of the wafer (i.e. the inspected area of a die×number of die inspected). In this manner, the randomly generated defects may be generated with substantially the same defect density as the detected defects. In one embodiment, randomly generating the set of defects includes randomly generating the set of defects using stochastic simulation (e.g., simulation that is nondeterministic in some manner, as opposed to being deterministic). For example, the randomly generated defects may be simulated using any appropriate stochastic simulation method, system, algorithm, technique, etc. (e.g., Monte Carlo simulation) In this manner, the set of randomly generated defects may include truly randomly generated defects.

In another embodiment, randomly generating the set of defects includes randomly generating the defects at locations arranged in a grid across the area. For example, the defects may be oriented in a regular grid across the area. In an additional embodiment, randomly generating the set of defects includes randomly generating the defects at locations having a substantially uniform distribution across the area. (Randomly generated defects oriented in a regular grid may also have a substantially uniform distribution across the area.) In some such embodiments, randomly generating the set of defects may include removing actual defects detected by inspection of a layer on a wafer from inspection results and replacing the actual defects with randomly generated defects so that the randomly generated defects are substantially uniformly distributed across the area. The inspection results may include any appropriate inspection results such as a KLARF, and the randomly generated set of defects may be stored in a different file (e.g., a different KLARF) in a similar file format. Therefore, the generated file may essentially be a snapshot of what results for random defects on the layer of the wafer should look like.

Figure 1:
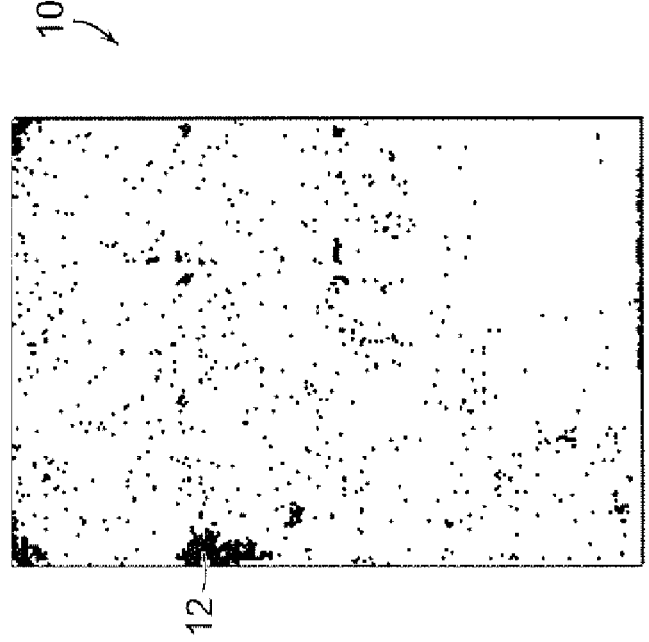
FIG. 1 is a die map illustrating one example of die stacking results showing actual defects detected on a wafer.

One example of inspection results generated by inspection of a layer on a wafer that may be used to randomly generate the set of defects is shown in FIG. 1. In particular, FIG. 1 shows die map 10 of die stacking results generated by inspecting a 65 nm polysilicon layer of a wafer. In particular, die map 10 shows locations of actual defects 12 detected in multiple dies on the polysilicon layer overlaid with one another by die stacking, Die stacking results may be generated in any suitable manner. The KLARF for die map 10 includes 10,000 defects. The KLARF for die map 10 was used to generate another KLARF for randomly generated defects by removing the actual defects detected by the inspection from die map 10 and replacing the actual defects with randomly generated defects so that the randomly generated defects are substantially uniformly distributed across the area. In particular, die map 10 was used to generate die map 14 shown in FIG. 2 that shows locations of randomly generated defects 16 across the area. Randomly generated defects 16 include 10,000 defects arranged in a 100 defect×100 defect grid (or two-dimensional array) across the area of the die on the layer of the wafer.

The defects in both KLARFs can be binned based on design as described further herein, and the numbers of actual and randomly generated defects in corresponding groups can be compared as described further herein to determine if each group of actual defects includes potentially systematic defects or potentially random defects. In this manner, the results of design based grouping for actual defects and randomly generated defects may be compared on a group by group basis to determine if groups of actual defects include potentially systematic defects or potentially random defects.

In a further embodiment, randomly generating the set of defects is performed such that a frequency of the randomly generated defects in each of the groups is approximately equal to a frequency of the portion of the design proximate the locations of the randomly generated defects in each of the groups across the area. For example, the defects may be randomly generated such that the randomly generated defects have a frequency that is approximately equal to the expected frequency of random defects for certain structures within the design. Although random defectivity can vary widely from wafer to wafer, the more frequently certain structures appear in the design the more random defects will in general be detected in the structures. In this manner, for portions of the design that appear across the wafer at a higher frequency, more defects may be randomly generated thereby better approximating the number of random defects that may be detected on a wafer in different portions of the design. As such, randomly generated defects may exhibit substantially the same distribution across a wafer as the distribution of design clips across the wafer thereby better approximating the distribution of random defects that may actually be detected on the wafer.

In some embodiments, the inspected area of at least the portion of the wafer is approximately equal to an inspected area of a die on the wafer. In this manner, the randomly generated defects do not have to be generated at different locations across an area corresponding to the inspected area of the entire wafer. Instead, the randomly generated defects may be generated for only a portion of the entire inspected area of the wafer (e.g., an inspected area of a die on the wafer), and the numbers of the randomly generated defects in each of the groups may be normalized as described further herein based on the total number of actual defects detected across the entire inspected area of the wafer, the portion of the entire inspected area for which the randomly generated defects were generated, and the entire inspected area of the wafer. In addition, instead of randomly generating defects across the wafer, the set of defects may be randomly generated across an inspected area of a die (which is equivalent to simulating across the wafer and then stacking the defects). Furthermore, the randomly generated defect counts can be normalized to match the detected defect count as described further herein.

The method also includes binning the set of randomly generated defects into groups such that a portion of a design on the wafer proximate locations of the randomly generated defects in each of the groups is substantially the same. In this manner, each of the groups of the randomly generated defects corresponds to a different portion of the design, and the randomly generated defects in each of the groups are located proximate substantially the same portion of the design. As such, the randomly generated defects may be separated into groups based on design (e.g., design clip). Binning the set of randomly generated defects into the groups based on design may be performed as described in commonly owned U.S.

patent application Ser. No. 11/561,735 by Kulkarni et al. published as U.S. Patent Application Publication No. 2007/0156379 on Jul. 5, 2007 and Ser. No. 11/561,659 Zafar et al. published as U.S. Patent Application Publication No. 2007/0288219 on Dec. 13, 2007, both of which were filed on Nov. 20, 2006, and both of which are incorporated by reference as if fully set forth herein. The embodiments described herein may include any step(s) of any method(s) described in these patent applications.

The method further includes determining a number of the randomly generated defects in each of the groups. The numbers of the randomly generated defects in the groups can be compared to numbers of actual defects in corresponding groups to determine if the actual defects in the corresponding groups are potentially systematic defects or potentially random defects. The numbers (e.g., the defect counts) of the randomly generated defects in the groups can be determined in any suitable manner. The numbers of the randomly generated defects in the groups can be compared to the numbers of the actual defects in the corresponding groups according to any of the embodiments described herein. In addition, determining if the actual defects in the groups are potentially systematic defects or potentially random defects may be performed based on results of the comparison according to any of the embodiments described herein.

In one embodiment, the method includes generating a Pareto chart for the set of randomly generated defects. This "random Pareto chart" can be constructed using any of the randomly generated defects described herein (e.g., truly randomly generated defects or defects that are oriented in a regular grid across the area). For example, the set of randomly generated defects may be binned into different groups based on design (e.g., design clip) as described further herein, and a Pareto chart may be generated for the set of randomly generated defects using results of the binning. As such, all of the defects in any one of the groups will be located proximate to the same (or substantially the same) portion of the design. Therefore, the Pareto chart for the randomly generated defects will show the numbers of defects binned into different groups, each of which corresponds to a different portion of the design.

Figure 3:
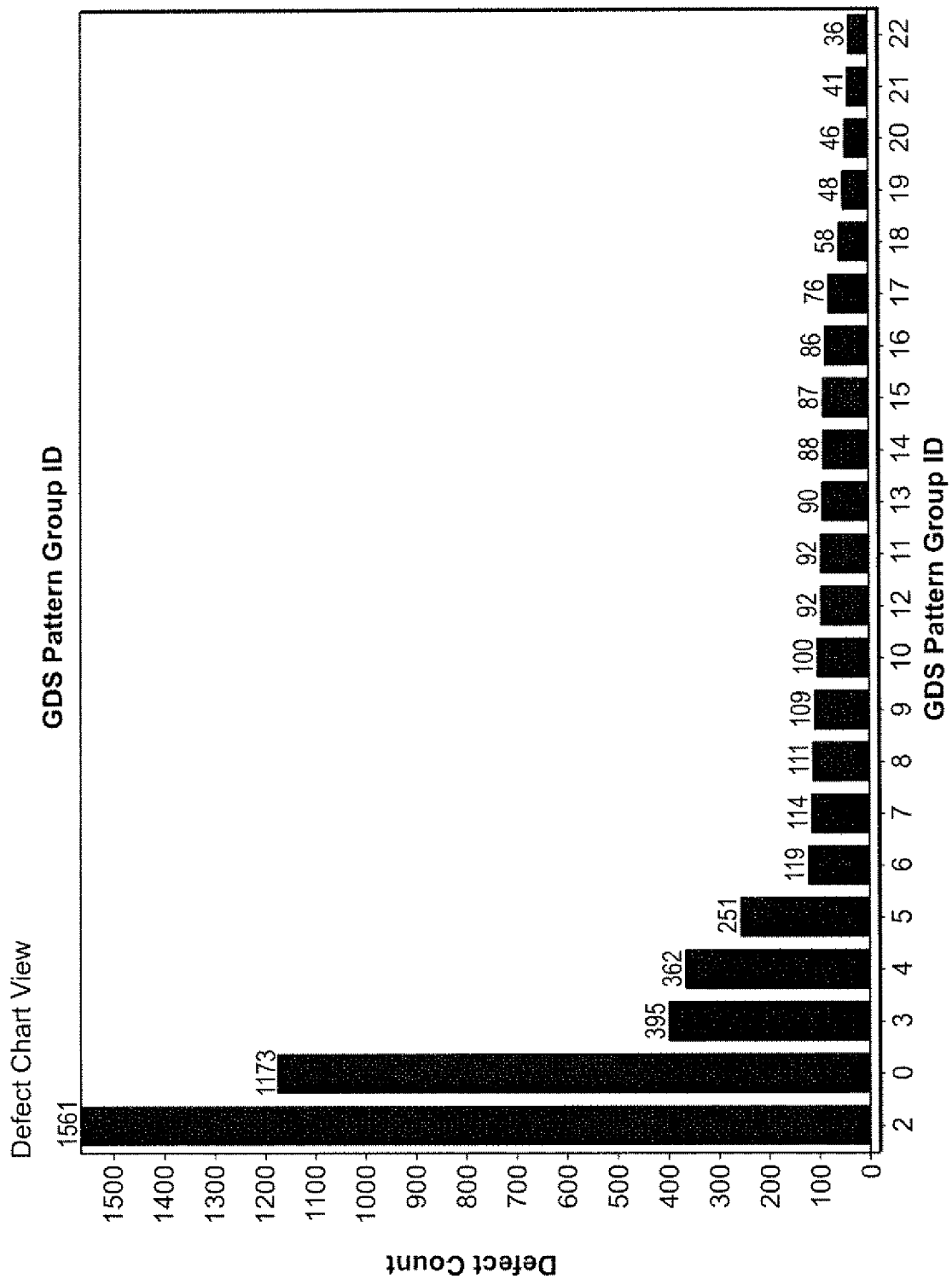
FIG. 3 is a Pareto chart, configured and generated according to embodiments described herein, for a set of randomly generated defects.

One embodiment of such a Pareto chart is shown in FIG. 3. In particular, as shown in FIG. 3, a Pareto chart generated for a set of randomly generated defects shows the GDS pattern group ID along the x axis and the defect count along the y axis. As such, the Pareto chart graphically illustrates the number of defects binned into each of the different groups, each of which corresponds to a different portion of the GDS pattern. In this manner, the numbers of the randomly generated defects and the numbers of the actual defects in corresponding groups can be compared as described further herein by comparing the Pareto chart for the set of the randomly generated defects to a Pareto chart for the actual defects. In particular, using the Pareto charts, numbers of randomly generated defects and actual defects in groups that have the same GDS pattern group ID, and therefore are corresponding groups, may be compared.

Multiple runs of randomly generating the set of defects may be performed to provide for a more statistically significant approximation of the total random distribution so from a limited sample. For example, in one embodiment, the method is performed more than once to determine additional numbers for a different set of randomly generated defects. The method may be performed more than once such that different sets of randomly generated defects may be separately randomly generated. Each of the different sets of the randomly generated defects may be randomly generated in the same or different manners (e.g., according to any of the embodiments described herein). The additional numbers for the different set of the randomly generated defects may be determined according to any of the embodiments described herein. The numbers and the additional numbers can be compared to the numbers of the actual defects in the corresponding groups to determine if the actual defects in the corresponding groups are potentially systematic defects or potentially random defects. The numbers for the different sets of the randomly generated defects in the groups can be compared to the numbers of the actual defects in the corresponding groups according to any of the embodiments described herein. In addition, determining if the actual defects in the corresponding groups are potentially systematic defects or potentially random defects may be performed based on the comparison to the numbers for the different sets of randomly generated defects according to any of the embodiments described herein. In some such embodiments, the method may include statistically combining results from multiple sets of randomly generated defects to determine the confidence interval for the count of each bin. This confidence interval can be used to assign a probability that a given bin is potentially systematic or could be used to set a threshold (e.g., bin as potentially systematic if count is greater than 90% confidence interval would indicate). In this manner, the randomly generating step may be statistically repeated to improve the confidence that the randomly generated population represents the actual population.

In another embodiment, the method is performed more than once to determine additional numbers for a different set of randomly generated defects, and the method includes using the additional numbers to validate the randomly generating step (in which the first set of randomly generated defects was generated). For example, the set of randomly generated defects (and the random Pareto chart) can be generated multiple times to validate the stability of the randomization process. In particular, the method may be performed more than once such that different sets of randomly generated defects are separately randomly generated. In this embodiment, each of the different sets of the randomly generated defects is preferably randomly generated in the same manner (e.g., according to any of the embodiments described herein). The additional numbers for the different set of the randomly generated defects may be determined according to any of the embodiments described herein. Validating the randomly generating step may include comparing the numbers for the different sets of randomly generated defects. The numbers for the different sets of the randomly generated defects in the groups can be compared on a group by group basis according to any of the embodiments described herein. In addition, validating the randomly generating step may include determining if the numbers for the different sets of randomly generated defects are similar enough to be considered statistically the same. Determining if the numbers are similar enough to be considered statistically the same may be performed in any appropriate manner.

The embodiments of the method described above may include any other step(s) of any other method(s) described herein. In addition, the embodiments of the method described above may be performed by any of the systems described herein.

Another embodiment relates to a computer-implemented method for creating a normalized set of groups of randomly generated defects for use in determining if corresponding groups of actual defects are potentially systematic defects or potentially random defects. The method includes determining a total number of all actual defects detected on a layer of a wafer. The actual defects included in the total number preferably do not include nuisance defects. In particular, nuisance defects are preferably removed from inspection results in any suitable manner prior to determining the total number. The actual defects may include defects detected on a layer of a patterned wafer. In addition, the method may or may not include detecting the actual defects on the layer of the wafer as described further herein. Furthermore, the method may or may not include removing the nuisance defects from the inspection results (e.g., if the wafer is inspected by another method, that method may include removing the nuisance defects from the inspection results and therefore the nuisance defects would not have to be removed from the inspection results by the methods described herein). Determining the total number of all of the actual defects detected on the layer may be performed in any suitable manner.

The method also includes normalizing numbers of randomly generated defects in groups to numbers of the actual defects in corresponding groups based on the total number of all of the actual defects detected on the wafer. A portion of a design on the wafer proximate locations of the randomly generated defects in each of the groups is substantially the same. Therefore, the randomly generated defects are grouped by design (e.g., by design clip), and the number of the randomly generated defects in each of the groups may be normalized based on total number of actual defects detected on the wafer. Normalizing the number of the randomly generated defects in each of the groups may be performed in any suitable manner (e.g., multiplying the number of randomly generated defects in each group by some factor so that the total number of randomly generated defects in all of the groups is approximately equal to the total number of actual defects detected on the wafer).

The total number of actual defects detected on the wafer may vary across wafers dramatically (e.g., due to variations in one or more processes used to fabricate the wafers and/or due to variations in the wafers themselves). As such, normalizing the number of the randomly generated defects in each of the groups may increase the accuracy with which potentially systematic defects can be differentiated from potentially random defects as described further herein. In addition, normalizing the number of the randomly generated defects in each of the groups based on the total number of actual defects detected on any given wafer increases the utility of the set of randomly generated defects (e.g., one set of randomly generated defects can be used for multiple wafers with relatively high accuracy regardless of the actual defectivity of different wafers). In addition, normalizing the number of randomly generated defects in each of the groups to defect density allows data to be compared from inspection recipe to inspection recipe for the same device. Such normalizing may be particularly advantageous for monitoring.

The normalized numbers of the randomly generated defects in the groups can be compared to numbers of the actual defects in the corresponding groups to determine if the corresponding groups of the actual defects are potentially systematic defects or potentially random defects. The normalized numbers of the randomly generated defects in the groups can be compared to the numbers of the actual defects in the corresponding groups according to any embodiments described herein. The results of such comparisons may be used to determine if the corresponding groups of the actual defects are potentially systematic defects or potentially random defects according to any embodiments described herein.

The embodiment of the method described above may include any other step(s) of any other method(s) described herein. In addition, the embodiment of the method described above may be performed by any of the systems described herein.

An additional embodiment relates to a computer-implemented method for determining if actual defects are potentially systematic defects or potentially random defects. The actual defects are detected on a wafer. In particular, the actual defects may be detected on a patterned wafer such that the actual defects may be grouped based on design as described further herein. The methods described herein may or may not include detecting the actual defects on the wafer. For example, the methods described herein may include inspecting the wafer using any suitable inspection method, system, and/or technique (e.g., by scanning the wafer with light, detecting light scattered from the wafer during the scanning, and detecting defects on the wafer using output responsive to the detected light). Alternatively, the methods described herein may include acquiring inspection results from another system (e.g., an inspection system), another method (e.g., a method performed to detect defects on the wafer), a storage medium (e.g., a fab database), etc.

A portion of a design on the wafer proximate a location of each of the actual defects in a group and each of the randomly generated defects in a corresponding group is substantially the same. In particular, the actual defects and the randomly generated defects may be binned into groups as described further herein based on a portion of a design proximate to the location of each of the defects. In this manner, the portion of the design proximate the locations of defects in a group may be substantially the same. In addition, different groups of actual defects correspond to different portions of the design, and different groups of randomly generated defects correspond to different portions of the design.

In one embodiment, the portion of the design corresponds to a design clip. The term "clip" as used herein refers to a relatively small portion of the design layout. For example, the term "clip" can be generally defined as the area in a design around a defect and can be thought of as the neighborhood of the defect. In addition, polygons define the pattern within the clip, but the polygons can partially extend beyond the clip. Therefore, each of the groups may correspond to a different portion of the design, and the different portions of the design may include different structures in the design. As such, the actual defects may be separated into groups based on design clip, and the randomly generated defects may be separated into groups based on design clip. In this manner, the numbers of the actual and randomly generated defects separated into groups corresponding to the same design clip may be compared as described further herein. In a similar manner, the actual and randomly generated defects may be separated into groups based on design using patch images of the defects. The patch images may be acquired in any suitable manner and may include any suitable such images. The actual and randomly generated defects may be separated into groups based on design (and design clip and/or patch images) as described in the above-referenced patent applications by Kulkarni et al. and Zafar et al., which are incorporated by reference as if fully set forth herein.

In some embodiments, prior to the comparing step described further herein, the method includes normalizing the number of the randomly generated defects in the group to the number of the actual defects in the group based on total number of the actual defects detected on the wafer and total number of the randomly generated defects. For example, the comparisons described further herein may be performed after a random Pareto chart has been normalized to a Pareto chart generated for the actual defects to account for differences in total defect count between the randomly generated defects and the actual defects. The number of the randomly generated defects in the group may be normalized to the number of the actual defects in a corresponding group according to any of the embodiments described herein.

The method includes comparing a number of actual defects in a group to a number of randomly generated defects in a group. In this manner, the method may include comparing an actual defect sample to a random defect sample. In addition, the number of actual defects in one group is compared to the number of randomly generated defects in a corresponding group. In particular, groups of actual defects and randomly generated defects that correspond to one another may include groups that include defects located proximate to the same (or substantially the same) portion of the design. In this manner, the number of actual defects located proximate to one portion of the design can be compared to the number of randomly generated defects located proximate to the same (or substantially the same) portion of the design. As such, the numbers of actual defects and randomly generated defects may be compared on a group basis and therefore a design basis. Comparing the numbers of the actual defects and the randomly generated defects in corresponding groups may be performed on a group basis according to any of the embodiments described herein.

In one embodiment, the comparing step includes comparing a Pareto chart generated for the actual defects to a Pareto chart generated for the randomly generated defects. In this manner, the comparing step may include comparing a distribution of randomly generated defects across pattern group to a distribution of actual defects across pattern group. In particular, the method may include comparing the design clip Pareto chart generated for the actual detected defects (actual Pareto chart) to a design clip Pareto chart generated for randomly generated defects (random Pareto chart).

Figure 4:
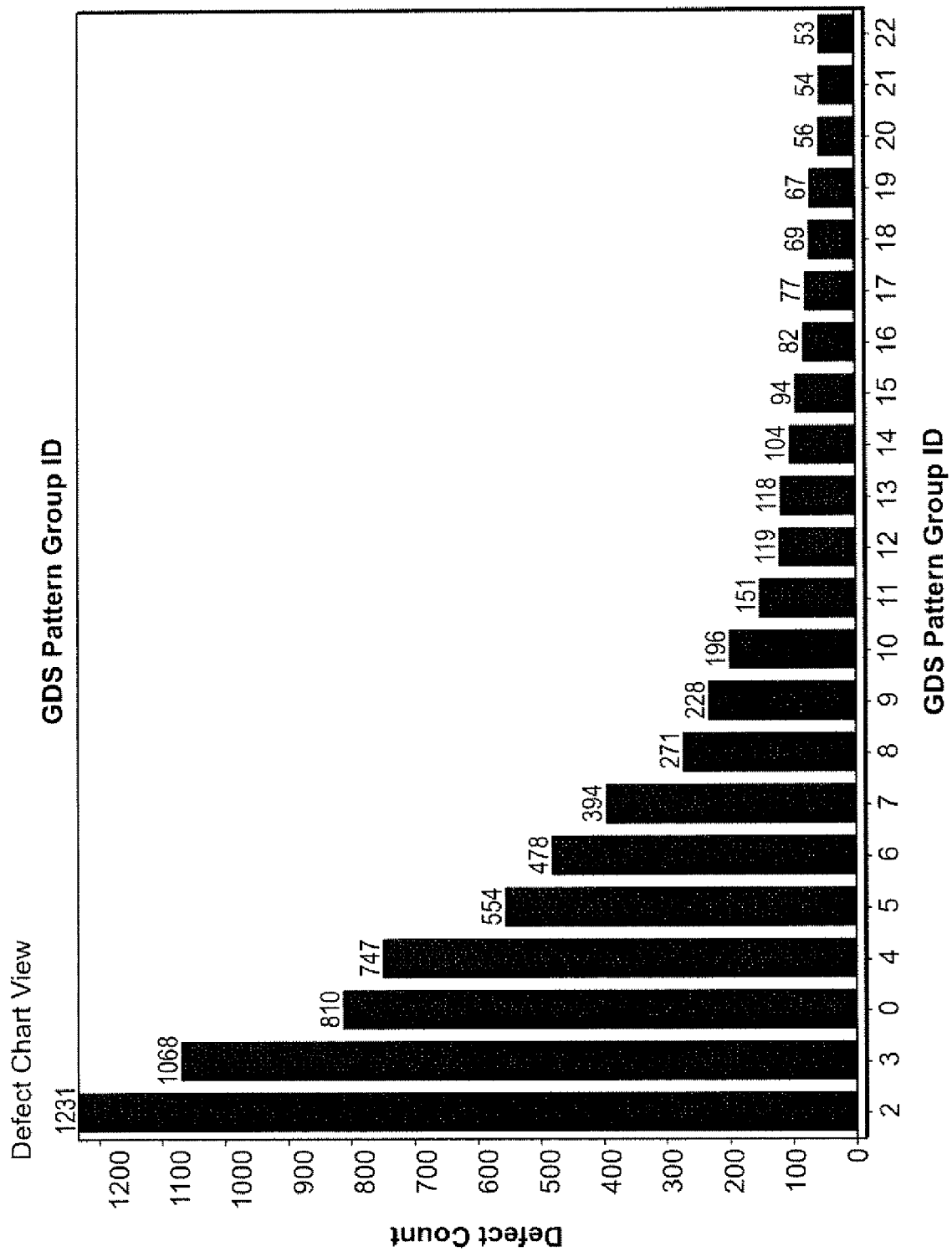
FIG. 4 is a Pareto chart, configured and generated according to embodiments described herein, for actual defects detected on a wafer.

One example of a Pareto chart generated according to embodiments described herein for actual defects is shown in FIG. 4. In particular, as shown in FIG. 4, the Pareto chart generated for the actual defects shows the GDS pattern group ID along the x axis and the defect count along the y axis. As such, the Pareto chart graphically illustrates the number of actual defects binned into each of the different groups, each of which corresponds to a different portion of the GDS pattern. Therefore, the Pareto chart illustrates the results of design based grouping performed for actual defects detected on a wafer.

In this manner, the numbers of the actual defects in groups can be compared to the numbers of the randomly generated defects in corresponding groups as described further herein by comparing the Pareto chart for the actual defects to a Pareto chart for the randomly generated defects. For example, corresponding groups of actual defects and randomly generated defects may be groups that have the same GDS pattern group ID. Therefore, groups of actual defects and randomly generated defects having the same GDS pattern group ID may be compared to each other to determine if any of the groups of actual defects are potentially systematic defects.

Figure 5:
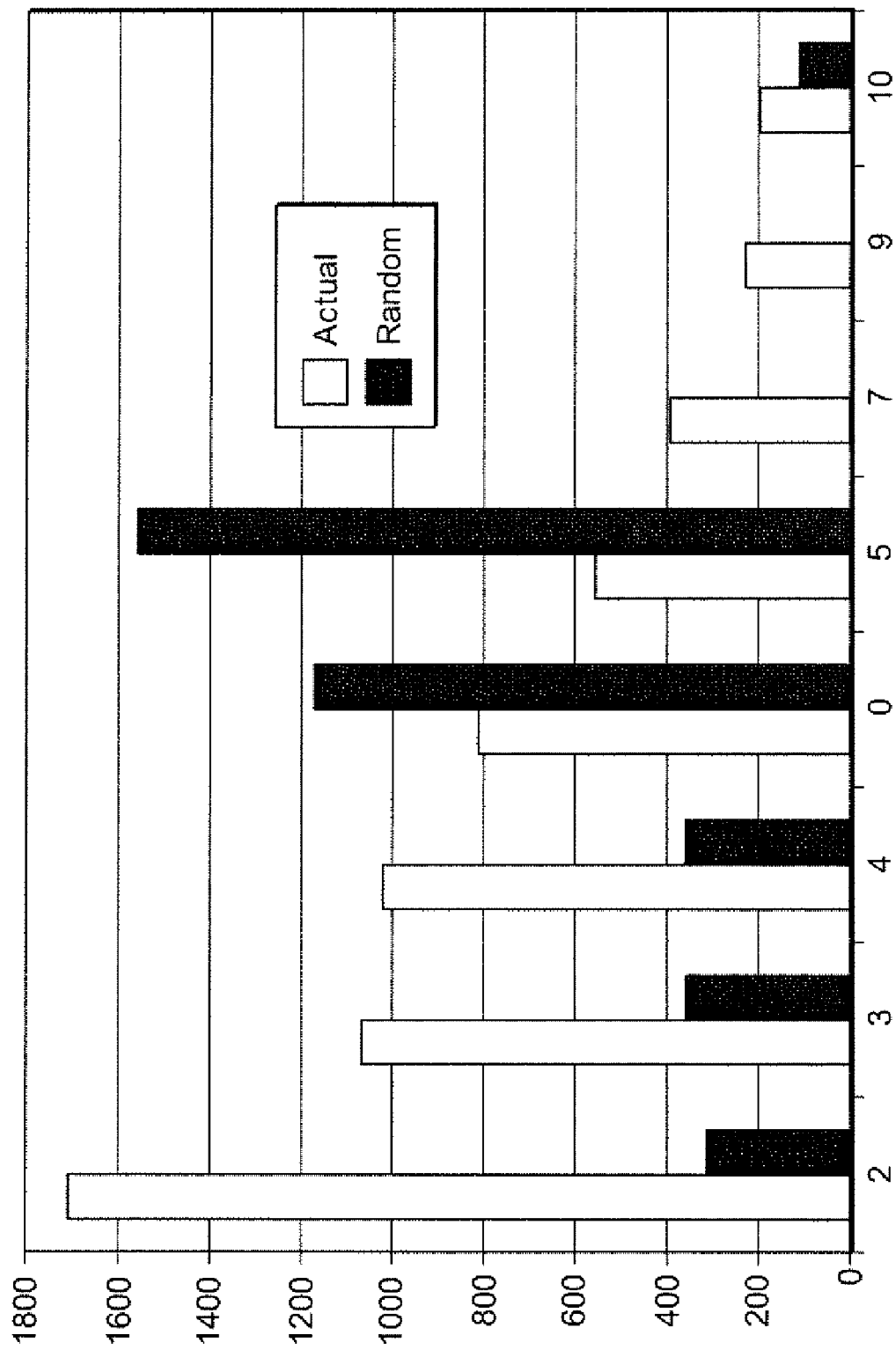
FIG. 5 is a Pareto chart, configured and generated according to embodiments described herein, showing results of comparing a Pareto chart generated for actual defects to a Pareto chart generated for randomly generated defects.

FIG. 5 illustrates one embodiment of results of comparison of a Pareto chart generated for actual defects to a Pareto chart generated for randomly generated defects. In particular, as shown in FIG. 5, the Pareto chart generated for a comparison of numbers of actual defects and randomly generated defects in corresponding groups shows the GDS pattern group ID along the x axis and the defect count for both the actual defects and the randomly generated defects along the y axis. As such, the Pareto chart shown in FIG. 5 graphically illustrates the numbers of actual defects and randomly generated defects binned into the different groups, each of which corresponds to a different portion of the GDS pattern.

In this manner, the Pareto chart shown in FIG. 5 shows how the numbers of the actual defects in different groups compare to the numbers of the randomly generated defects in corresponding groups. In this manner, the results of the comparison illustrated by the Pareto chart shown in FIG. 5 can be used to determine if groups of actual defects are potentially systematic defects or potentially random defects as described further herein. In particular, the actual defects binned into groups 2, 3, 4, and 10 may be determined to be potentially systematic defects based on the comparison results shown in the Pareto chart of FIG. 5 while the actual defects binned into groups 0, 5, 7, and 9 may be determined to be potentially random defects based on the comparison results shown in the Pareto chart of FIG. 5.

In another embodiment, the comparing step includes determining a ratio of the number of the actual defects in the group to the number of the randomly generated defects in the group. The ratio of the number of the actual defects in the group to the number of the randomly generated defects in the group may be determined in any suitable manner. In addition, the ratio may be a relative ratio, which may also be determined in any suitable manner. In this manner, the ratio of the number of actual defects to the number of randomly generated defects in groups corresponding to the same (or substantially the same) portion of the design may be determined, which provides a measure of the differences between the numbers of actual defects and randomly generated defects corresponding to the same (or substantially the same) portion of the design. Therefore, the ratio can be used to determine if groups of actual defects are potentially systematic defects or potentially random defects as described further herein.

The method also includes determining if the actual defects in the group are potentially systematic defects or potentially random defects based on results of the comparing step. For example, if there is a significant difference between the number of actual defects in a group and the number of randomly generated defects in a corresponding group, the actual defects in the group may be determined to be potentially systematic defects. A significant difference may be defined statistically (e.g., a significant difference may be a statistically significant difference). For example, almost all corresponding groups of actual and randomly generated defects may include different numbers of actual defects and randomly generated defects (e.g., due to natural variability in the processes performed on the wafers and/or due to natural variations in the wafers themselves). Therefore, the method may include determining if differences between numbers of actual defects and randomly generated defects in corresponding groups are statistically significant differences, which may be performed in any suitable manner.

In another example, the ratio of the number of the actual defects in the group to the number of the randomly generated defects in the group, which may be determined as described above, may be used to determine if the actual defects in the group are likely to be systematic defects. For example, if the ratio of the number of the actual defects in the group to the number of the randomly generated defects in the group is 1 or statistically close to 1, the actual defects in the group may be determined to be potentially random defects. However, if the ratio of the number of the actual defects in the group to the number of the randomly generated defects in the group is statistically greater than 1, the actual defects in the group may be determined to be potentially systematic defects since systematic defect groups may be defect groups that have a relatively high ratio of actual defect count to randomly generated defect count. Determining if the ratio is statistically greater than 1 may be performed in any suitable manner.

The number of the randomly generated defects in the group that is used to determine the ratio may be the normalized number of randomly generated defects in the group since the randomly generated defects may be generated on a die basis while the number of the actual defects in the group will be wafer-based (e.g., based on the number of the actual defects detected across the wafer) or inspection plan-based (e.g., based on the area inspected on the wafer). Therefore, normalization may account for the different areas across which the randomly generated defects are generated and the actual defects are detected thereby increasing the accuracy of the determination of whether the actual defects are likely to be systematic defects.

Normalization may be performed as described further herein. Obviously, if the number of randomly generated defects in the group that is used to determine the ratio is the normalized number, such normalization would be performed before determining the ratio. Such normalization may also be performed before any other comparisons described herein. As described further herein, normalization may be performed because the total number of defects may be different. For example, a ratio of 1 (or any fixed number from run to run) may be used to identify potentially systematic defects unless the randomly generated defects and the actual defects have roughly the same number. In one such example, a population of randomly generated defects may be generated to have substantially the same count as a population of actual defects or a predetermined population of randomly generated defects may be normalized to the actual defects. Another way of looking at this is that the bins are normalized based on the total population counts for each of the populations so that we can compare them to each other.

In one embodiment, the determining step includes determining that the actual defects in the group are potentially systematic defects if the number of the actual defects in the group is greater than the number of the randomly generated defects in the group and determining that the actual defects in the group are potentially random defects if the number of the actual defects in the group is not greater than the number of the randomly generated defects in the group. For example, if the occurrence of a design clip group in an actual Pareto chart is significantly higher than the corresponding design clip group in the random Pareto chart, the design clip group of actual defects may be binned as potentially systematic. The numbers that are compared in such a determination may include absolute defect count or relative defect count. Potentially systematic defects may be identified in such a manner since systematic defects tend to occur more frequently than defects caused by chance alone. Therefore, if the number of actual defects in any group is significantly greater than the number of randomly generated defects in a corresponding group, then the actual defects in that group are likely systematic defects and can be determined as such by the embodiments described herein. In addition, such embodiments may include matching (or normalizing) the defects densities in both groups, which may be performed as described further herein. Such matching or normalizing may be advantageous since if there are two groups, group a and group b, and the number of defects in group b is low (e.g., due to lower capture rate), then the number of defects in group a will always be high enough to make it potentially systematic even though it may be potentially random.

In another embodiment, the determining step includes determining that the actual defects in the group are potentially systematic defects if the number of the actual defects in the group is statistically greater than the number of the randomly generated defects in the group and determining that the actual defects in the group are potentially random defects if the number of the actual defects in the group is not statistically greater than the number of the randomly generated defects in the group. In this manner, the method may include statistically differentiating between potentially random and potentially systematic defects. As such, the methods may include statistically identifying marginalities in patterns in a design on a wafer. In particular, the method may include using statistical marginalities to identify potentially systematic defect bins by comparing them to a random distribution of defects. For example, the method may include performing a statistical test of the results of the comparison to determine if there is a significant difference between the actual defects in a group and the randomly generated defects in a corresponding group. If there is a significant difference, then the actual defects in the group may be determined to be potentially systematic defects. The numbers that are compared in such a determination may include absolute defect count or relative defect count.

In one embodiment, the method is performed separately for different groups of actual defects detected on the wafer, and a portion of the design on the wafer proximate a location of each of the actual defects in each of the different groups is substantially the same. For example, the actual and random Pareto charts may be compared as described further herein, and since the actual and random Pareto charts include defects separated into design based groups (e.g., design clip groups), the actual defects in each of the groups can be separately binned as likely including systematic defects or random defects by comparing the Pareto charts. The likely systematic design clip groups may be identified using results of comparison of the Pareto charts as described further herein.

In another embodiment, the method is performed separately for all groups of actual defects detected on the wafer, and a portion of the design on the wafer proximate a location of each of the actual defects in each of all of the groups is substantially the same. In this manner, the method can determine if potentially systematic defects occur anywhere on the Pareto chart generated for the actual defects. In addition, the method can substantially accurately identify potentially systematic defects that occur anywhere on the actual Pareto chart. For example, a Pareto chart may include thousands of different groups of defects binned based on design, but the embodiments described herein can easily, quickly, and substantially accurately determine if each of the thousands of different groups likely includes systematic or random defects. In this manner, the method does not need to know where in the Pareto chart (or which groups in the Pareto chart) to look for potentially systematic defects since all groups can be tested.

The method may also be performed separately for different regions on the wafer.

In a further embodiment, the method includes comparing the number of the actual defects in the group to a number of different randomly generated defects in a different group. A portion of the design proximate the location of each of the actual defects in the group and a location of each of the different randomly generated defects in the different group is substantially the same. The randomly generated defects and the different randomly generated defects are separately generated. In one such embodiment, the determining step includes determining if the actual defects in the group are potentially systematic defects or potentially random defects based on the results of comparing the number of the actual defects in the group to the number of the randomly generated defects in the group and the number of the different randomly generated defects in the group.

Figure 6:
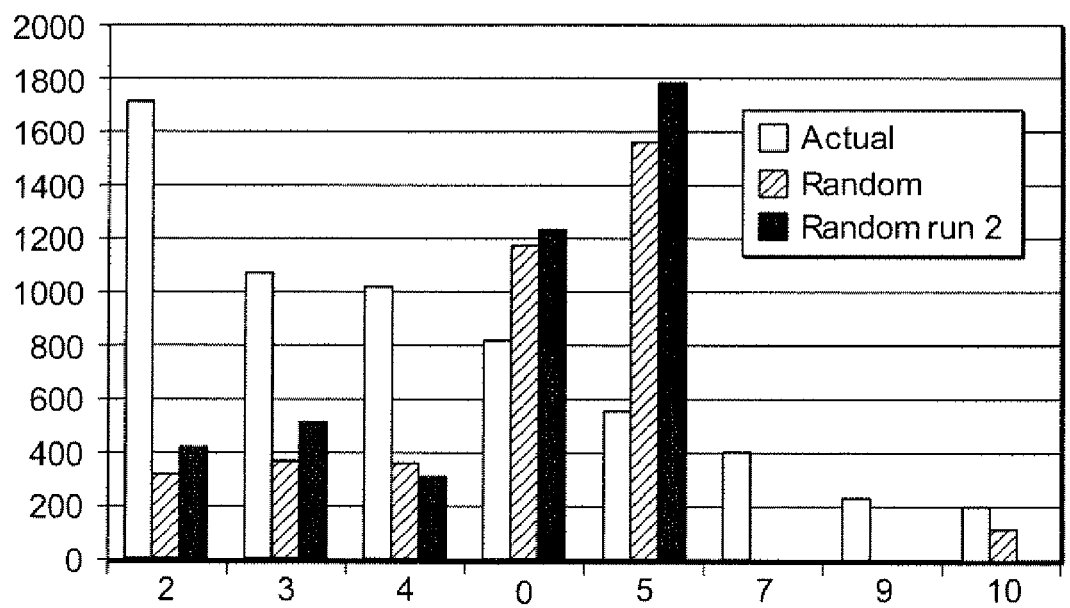
FIG. 6 is a Pareto chart, configured and generated according to embodiments described herein, showing results of comparing a Pareto chart generated for actual defects to two Pareto charts generated for two different sets of randomly generated defects.

In this manner, the method may include comparing one group of actual defects to multiple groups of separately randomly generated defects to determine if the group of actual defects includes potentially systematic defects or potentially random defects. Such comparisons may be performed according to any of the embodiments described herein. For example, such comparisons may be performed using Pareto charts. One embodiment of a Pareto chart that shows results of comparing a Pareto chart generated for actual defects to two Pareto charts generated for two different sets of randomly generated defects is shown in FIG. 6. In particular, as shown in FIG. 6, the Pareto chart generated for a comparison of numbers of actual defects and two different sets of separately randomly generated defects shows the GDS pattern group ID along the x axis and the defect count for the actual defects and the different sets of the randomly generated defects along the y axis. As such, the Pareto chart graphically illustrates the number of actual defects and separately randomly generated defects binned into the different groups, each of which corresponds to a different portion of the GDS pattern. In this manner, the Pareto chart shown in FIG. 6 shows how the numbers of the actual defects in different groups compare to the numbers of the separately randomly generated defects in the corresponding groups.

The results of the comparison illustrated by the Pareto chart shown in FIG. 6 can, therefore, be used to determine if groups of actual defects are potentially systematic defects or potentially random defects as described further herein. In particular, the actual defects binned into groups 2, 3, 4, and 10 may be determined to be potentially systematic defects based on the comparison results show in the Pareto chart of FIG. 6 while the actual defects binned into groups 0, 5, 7, and 9 may be determined to be potentially random defects based on the comparison results shown in the Pareto chart of FIG. 6. Groups in the Pareto charts of FIGS. 5 and 6 that have the same ID correspond to the same portion of the design. Therefore, the results shown in FIG. 6 confirm the results shown in FIG. 5 thereby confirming the validity of using one set of randomly generated defects for discriminating between potentially systematic and potentially random defects detected on a wafer. In addition, although the numbers of the actual defects in different groups may be compared to numbers of different sets of randomly generated defects in corresponding groups as described above, the data for the different sets of randomly generated defects may be combined and then compared to the numbers of the actual defects in the different groups to improve the statistics.

In some embodiments, the actual defects are detected by inspection of a layer on the wafer, and the randomly generated defects are generated (and grouped) once for an inspection recipe for the layer on the wafer (since different inspection recipes may inspect different areas on the wafer) and used for performing the method for defects detected on the layer of multiple wafers using the inspection recipe. For example, a random Pareto chart can be generated once for a recipe and stored and used for a comparison each time that an inspection is performed for the layer of any wafer using the inspection recipe. The comparison that is performed each time that an inspection is performed for the layer of any wafer may be performed according to any embodiments described herein (e.g., including steps such as normalization of the randomly generated defects). In this manner, the method may be implemented each time a wafer is inspected using the inspection recipe and an actual defect design clip Pareto chart is generated. The random Pareto chart may be generated as described herein and used as described herein.

In another embodiment, the method is performed without user intervention. Since no user intervention is required, the method may be automated. In this manner, the method may be performed automatically. As such, the method provides an automated method for determining whether a given collection of defects grouped by design (e.g., design clip) is potentially systematic or potentially random in nature.

The embodiments described herein may be used in a number of different manners. For example, systematic discovery and monitoring using design based binning is not very good at distinguishing between bins that are potentially systematic and bins that are potentially random when defect count is used. One proposed method includes using simulated random defect design based grouping (DBG) bin distribution to determine which bins are potentially systematic. This method assumes constant capture rates between bins, which may be a substantially limiting assumption. Therefore, better ways to prioritize bins and determine cut-lines are desirable. Ideally, such methods are not sensitive to capture rate differences across bins.

The embodiments described herein, however, may be used for systematic discovery. In one such example, the bins determined to include potentially systematic defects may be prioritized from most likely to be systematic to least likely to be systematic. For example, the DBG groups can be prioritized by the ratio described further herein. In one such example, the Pareto chart can be re-charted based on ratio v. count. The higher the ratio, the more likely a group could be potentially systematic. The bins may then be reviewed in order of priority (from most likely to include systematic defects to least likely to include systematic defects).

In another example, the embodiments described herein may be used for monitoring. In particular, the embodiments described herein may be used for monitoring potentially systematic defects separately from potentially random defects. If the systematic count overall or within at least one bin gets too high, results can be used to hold the lot for engineering analysis (e.g., systematic discovery use case).

In another example, the methods described herein can be used in a design based classification (DBC) use case. DBC may be performed as described in the patent applications by Kulkarni et al. and Zafar et al., which are incorporated by reference above. For example, a wafer lot with a substantial number of random defects will increase the count in DBC bins, especially those bins with relatively high area across the wafer. Since it is unlikely that the defect counts of all DBC bins will increase proportionally except due to a random component, the total defect population may be examined to determine a best fit for random defects. Then, based on pattern of interest (POI) size, the defect density bin may be determined and compared with this random defect density. The DBC bin count can then be corrected based on random distribution.

In addition, if a POI or a set of POI is known not to have systematic defects, the defects detected in the POI or set of POI can be used as a surrogate or proxy to measure the random defect density. The random density may then be subtracted from the DBC bins and used to prioritize the DBG bins.

In some such examples, separating potentially systematic defect bins from potentially random defect bins may include setup to determine the equivalent area per most common DBG bins. Determining the equivalent area per most common DBG bins may include, at the time of recipe creation, dropping defects randomly in the inspected area to a predefined defect density, performing DBG, and for each bin, filtering out relatively low count bins (if there is a systematic signal on these patterns they will be easy to spot) and determining the equivalent area for that bin based on the count and the predefined defect density. For example, equivalent area for bin 1, $EA_1$, may be determined as (Bin 1 count)/(defect density). The equivalent area information and "seed" clips may be stored with the recipe.

Setup may also include selecting a DBC bin for monitoring random defects. For example, a pattern or patterns of interest unlikely to have any systematic defects (e.g., blank clip or simple patterns) may be selected. These DBC bins can be used to monitor random defects. The effective area of the pattern may be determined from simulated data. For example, the area of the pattern plus a border to cover extending bounding box (EBB) may be determined. A design example may be marked for random monitoring, and the effective area ($EA_r$) may be stored with DBC design examples.

Separating potentially systematic defect bins from potentially random defect bins may also include using DBC to estimate the random defect density during WPP. For example, using DBC to estimate the random defect density may include estimating the random defect density from the inspection defect count for this bin and the area. If there is a random defect excursion, it will be detected by the monitor. The monitor count may be used to estimate random defect density, $DD_r = $(Inspection Bin, Count)/$EA_r$). In addition, multiple monitors may be averaged.

Separating potentially systematic defect bins from potentially random defect bins may also include correcting DBC bin count. For example, if there is a random defect excursion, it will be detected by the monitor. As such, the monitor count may be used to determine the random defect density. For each DBC bin, the count may be converted to a to defect density based on the POI area plus EBB (e.g., $DD_n = (Bin_n\ Count)/(EA_n)$). For each DBC bin, the estimated random defect density may be subtracted to estimate the true systematic count (e.g., $Bin_n\ Count)_{sys} = (DD_n - DD_r)*(EA_n))$ for monitoring. Systematic bin counts greater than about 0 are potentially systematic. The higher the systematic bin count, the more likely the bin has a systematic issue.

Separating potentially systematic defect bins from potentially random defect bins may further include correcting DBG bin count. For example, for each DBG bin, the count may be converted to defect density using the equivalent area (e.g., $DD_n = (Bin_n\ Count)/(EA_n)$). The estimated random defect density (area based on the EBB) may then be subtracted. The result is presumably systematic defect count (e.g., $(Bin_n\ Count)_{sys} = (DD_n - DD_r)*(EA_n)$). Systematic bin counts greater than about 0 are potential systematic. The higher the systematic bin count, the more likely the bin has a systematic issue.

One significant advantage of such methods is that by using the DBC monitor, the capture rate of the random defect distribution can also be monitored and assuming it is truly random on the monitor, we can accurately subtract out these random defects. In particular, random defect correction is based on the measured random defect capture rate. It is much better to assume that the random defect capture rate is constant than the capture rate is constant between groups. The capture rate may still vary by pattern density. Since groups have different pattern densities on average, there still may be some inherent error. It might be possible to compensate if DBC bins spanning various pattern densities were monitored and bins were corrected with an interpolated $DD_r$. Furthermore, auto-systematic threshold is advantageously dynamic based on the random monitor count.

In one embodiment, the results of the method (e.g., binned potentially systematic defects) may be used for analysis. The analysis may include any suitable analysis (e.g., analysis of the process and/or wafer).

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. For example, after a method described above creates a set of groups of randomly generated defects, the method may include storing information about the set of the groups of the randomly generated defects in a storage medium. In addition, results or output of the embodiments described herein may be stored and accessed by an inspection system such that the inspection system can use the results (e.g., a Pareto chart for a set of randomly generated defects) to discriminate between potentially systematic and potentially random defects detected on a layer of a wafer. Furthermore, the results may be stored "permanently," "semi-permanently," temporarily, or for some period of time. For example, the storage medium may be random access memory RAM), and the results may not necessarily persist indefinitely in the storage medium.

Each of the embodiments of the method described above may include any other step(s) of any other method(s) described herein. In addition, each of the embodiments of the method described above may be performed by any of the systems described herein.

The embodiments described herein provide a number of advantages over other methods for determining if defects are potentially systematic defects or potentially random defects. For example, identifying potentially systematic and potentially random defects using the embodiments described herein can be performed without user intervention and judgment. In particulars no user intervention is required so the entire process can advantageously be automated (although the user may review the defects identified as potentially systematic and potentially random to determine which defects are actually systematic and/or random defects). In addition, the embodiments described herein have higher accuracy than currently used methods for differentiating between potentially systematic defects and potentially random defects. Furthermore, the methods can more accurately determine if potentially systematic defects occur anywhere on an actual defect Pareto chart. Therefore, the embodiments described herein can provide accuracy and automation for the identification of potentially systematic defects.

Figure 7:
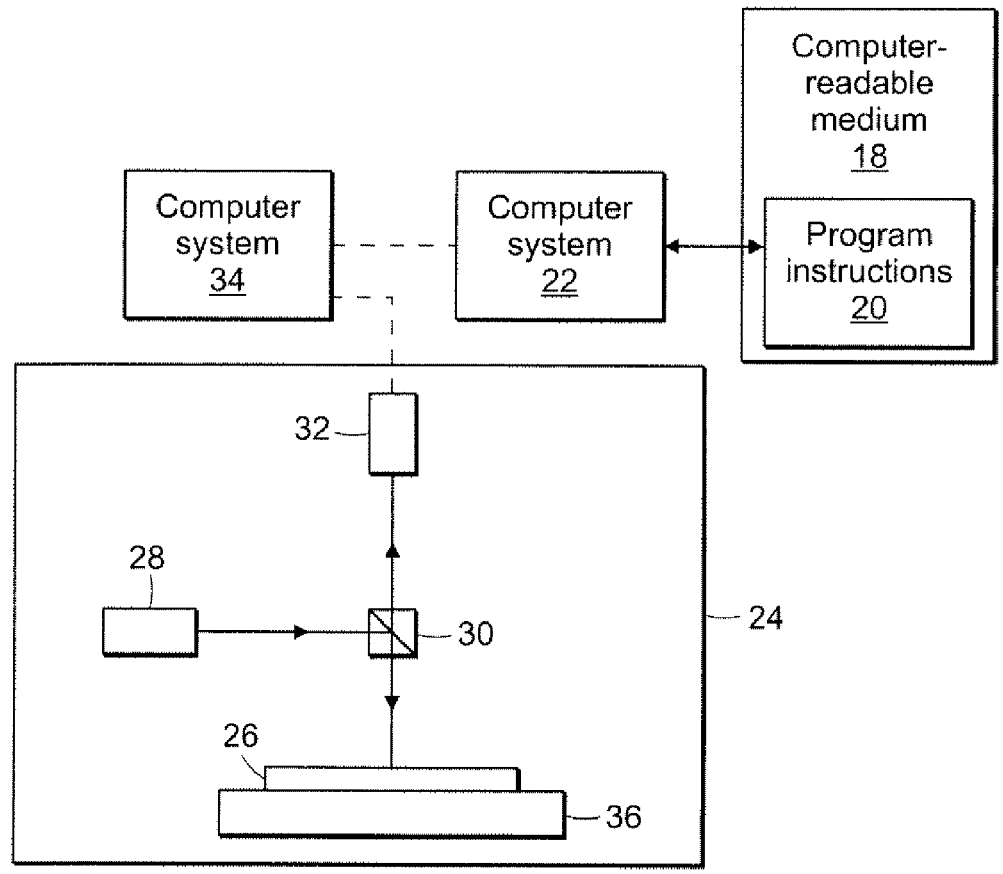
FIG. 7 is a schematic diagram illustrating a side view of one embodiment of a computer-readable medium that includes program instructions executable on a computer system for performing one or more embodiments of one or more computer-implemented methods described herein and one embodiment of a system configured to perform one or more computer-implemented methods described herein.

Another embodiment relates to a computer-readable medium that includes program instructions executable on a computer system for performing one or more computer-implemented methods described herein. One embodiment of such a computer-readable medium is shown in FIG. 7. In particular, computer-readable medium 18 includes program instructions 20 executable on computer system 22 for performing one or more of the computer-implemented methods described herein. In addition, the computer-implemented method executable on the computer system by the program instructions may include any step(s) of any method(s) described herein.

Program instructions 20 implementing methods such as those described herein may be transmitted over or stored on computer-readable medium 18. The computer-readable medium may be a transmission medium such as a wire, cable, or wireless transmission link. The computer-readable medium may also be a storage medium such as a read-only memory, a random access memory, a magnetic or optical disk, or a magnetic tape.

Computer system 22 may take various forms, including a personal computer system, mainframe computer system, workstation, image computer, parallel processor, or any other device known in the art. In general, the term "computer system" may be broadly defined to encompass any device having one or more processors, which executes instructions from a memory medium.

An additional embodiment relates to a system configured to perform one or more of the embodiments described herein. The system may include an inspection system configured to detect actual defects on a wafer. One embodiment of such a system is shown in FIG. 7. For example, as shown in FIG. 7, the system includes inspection system 24. Inspection system 24 is configured to detect actual defects on wafer 26.

In one embodiment, inspection system 24 includes light source 28. Light source 28 may include any appropriate light source known in the art. Light source 28 may be configured to direct light to beam splitter 30. Beam splitter 30 may be configured to direct light from light source 28 to wafer 26 at a substantially normal angle of incidence. Beam splitter 30 may include any appropriate optical component known in the art.

Light reflected from wafer 26 may pass through beam splitter 30 to detector 32. Detector 32 may include any appropriate detector known in the art. Output generated by detector 32 may be used to detect actual defects on wafer 26. For example, computer system 34 may be configured to detect actual defects on wafer 26 using output generated by the detector. The computer system may use any method and/or algorithm known in the art to detect actual defects on the wafer. The computer system may be coupled to the detector in any suitable manner (e.g., by one or more transmission media indicated by the dotted line shown in FIG. 7, which may include any suitable transmission media known in the art) such that the computer system can receive the output generated by the detector. Furthermore, if the inspection system includes more than one detector (not shown), the computer system may be coupled to each detector as described above. Computer system 34 may be further configured as described herein. During inspection, wafer 26 may be disposed on stage 36. Stage 36 may include any appropriate mechanical and/or robotic assembly known in the art. The inspection system shown in FIG. 7 may also include any other suitable components (not shown) known in the art.

As shown in FIG. 7, the inspection system is configured to detect light specularly reflected from the wafer. In this manner, the inspection system shown in FIG. 7 is configured as a BF inspection system. However, the inspection system may be replaced by an inspection system configured as a dark field (DF) inspection system, an edge contrast (EC) inspection system, an aperture mode inspection system, or any other optical inspection system known in the art. In addition, the inspection system may be configured to perform one or more inspection modes. For example, the inspection system shown in FIG. 7 may be configured to perform DF inspection by altering an angle of incidence at which the light is directed to the wafer and/or an angle at which light is collected from the wafer. In another example, the inspection system shown in FIG. 7 may be configured such that one or more optical components (not shown) such as apertures may be positioned in the illumination path and the collection path such that the inspection system can perform EC mode inspection and/or an aperture mode of inspection.

It is noted that FIG. 7 is provided herein to generally illustrate one configuration of an inspection system that may be included in the system embodiments described herein. Obviously, the inspection system configuration described herein may be altered to optimize the performance of the inspection system as is normally performed when designing a commercial inspection system. In addition, the systems described herein may be implemented using an existing inspection system (e.g., by adding functionality described herein to an existing inspection system) such as the Puma 9000 and 9100 series of tools that are commercially available from KLA-Tencor, San Jose, Calif. For some such systems, the methods described herein may be provided as optional functionality of the system (e.g., in addition to other functionality of the system). Alternatively, the system described herein may be designed "from scratch" to provide a completely new system.

In another embodiment, the optical inspection system shown in FIG. 7 may be replaced by an electron beam inspection system. Examples of commercially available electron beam inspection systems that may be included in the system of FIG. 7 include the eS25, eS30, and eS31 systems from KLA-Tencor.

Computer system 22 and/or computer system 34 may be configured to perform one or more of the computer-implemented method embodiments described herein (e.g., using inspection results generated by computer system 34). In embodiments of the system that include the inspection system, computer system 22 may be coupled to the inspection system in any manner known in the art. For example, computer system 22 may be coupled to computer system 34 of inspection system 24 such that the computer system can receive results of inspection generated by computer system 34. In addition, computer system 22 may receive any other output of the detector or computer system 34 such as image data and signals.

Computer system 22 described above may be configured as a stand-alone system that does not form part of a process, inspection, metrology, review, or other tool. In such an embodiment, computer system 22 may be configured to receive and/or acquire data or information from other systems (e.g., inspection results from an inspection system) by a transmission medium that may include "wired" and/or "wireless" portions. In this manner, the transmission medium may serve as a data link between the computer system and the other system. In addition, computer system 22 may send data to another system via the transmission medium. Such data may include, for example, one or more parameters of the inspection system to be used for inspection of the layer of additional wafers determined by the computer system. Alternatively, computer system 22 may form part of the inspection system. In some such embodiments, the system may include only one of the computer systems shown in FIG. 7, which is configured to perform defect detection and one or more of the embodiments described herein.

The embodiments of the system shown in FIG. 7 may be further configured as described herein. In addition, the system may be configured to perform any step(s) of any of the method embodiment(s) described herein.

Further modifications and alternative embodiments of various aspects of the invention may be apparent to those skilled in the art in view of this description. For example, computer-implemented methods for determining if actual defects are potentially systematic defects or potentially random defects are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A computer-implemented method for determining if actual defects are potentially systematic defects or potentially random defects, comprising:
    comparing a number of actual defects in a group to a number of randomly generated defects in a group, wherein the actual defects are detected on a wafer, and wherein a portion of a design on the wafer proximate a location of each of the actual defects in the group and each of the randomly generated defects in the group is substantially the same; and
    determining if the actual defects in the group are potentially systematic defects or potentially random defects based on results of said comparing, wherein said determining comprises determining that the actual defects in the group are potentially systematic defects if the number of the actual defects in the group is greater than the number of the randomly generated defects in the group and determining that the actual defects in the group are potentially random defects if the number of the actual defects in the group is not greater than the number of the randomly generated defects in the group, and wherein said comparing and said determining are performed using a computer system.

2. The method of claim 1, wherein said comparing comprises comparing a Pareto chart generated for the actual defects to a Pareto chart generated for the randomly generated defects.

3. The method of claim 1, wherein said comparing comprises determining a ratio of the number of the actual defects in the group to the number of the randomly generated defects in the group.

4. The method of claim 1, wherein the portion of the design corresponds to a design clip.

5. The method of claim 1, wherein the method is performed separately for different groups of actual defects detected on the wafer, and wherein a portion of the design on the wafer proximate a location of each of the actual defects in each of the different groups is substantially the same.

6. The method of claim 1, wherein the method is performed separately for all groups of actual defects detected on the wafer, and wherein a portion of the design on the wafer proximate a location of each of the actual defects in each of said all groups is substantially the same.

7. The method of claim 1, wherein the method is performed without user intervention.

8. The method of claim 1, wherein the actual defects are detected by inspection of a layer on the wafer, and wherein the randomly generated defects are generated once for an inspection recipe for the layer on the wafer and used for performing the method for defects detected on the layer of multiple wafers using the inspection recipe.

9. The method of claim 1, wherein said determining further comprises determining that the actual defects in the group are potentially systematic defects if the number of the actual defects in the group is statistically greater than the number of the randomly generated defects in the group and determining that the actual defects in the group are potentially random defects if the number of the actual defects in the group is not statistically greater than the number of the randomly generated defects in the group.

10. The method of claim 1, wherein, prior to said comparing, the method further comprises normalizing the number of the randomly generated defects in the group to the number of the actual defects in the group based on total number of the actual defects detected on the wafer and total number of the randomly generated defects.

11. The method of claim 1, further comprising comparing the number of the actual defects in the group to a number of different randomly generated defects in a different group, wherein a portion of the design proximate the location of each of the actual defects in the group and a location of each of the different randomly generated defects in the different group is substantially the same, wherein the randomly generated defects and the different randomly generated defects are separately generated, and wherein said determining further comprises determining if the actual defects in the group are potentially systematic defects or potentially random defects based on the results of said comparing the number of the actual defects in the group to the number of the randomly generated defects in the group and the number of the different randomly generated defects in the group.

12. A non-transitory computer-readable medium, comprising program instructions executable on a computer system for performing a computer-implemented method for determining if actual defects are potentially systematic defects or potentially random defects, wherein the computer-implemented method comprises:
    comparing a number of actual defects in a group to a number of randomly generated defects in a group, wherein the actual defects are detected on a. wafer, and wherein a portion of a design on the wafer proximate a location of each of the actual defects in the group and each of the randomly generated detects in the group is substantially the same; and
    determining if the actual defects in the group are potentially systematic defects or potentially random defects based on results of said comparing, wherein said determining comprises determining that the actual defects in the group are potentially systematic defects if the number of the actual defects in the group is greater than the number of the randomly generated defects in the group and determining that the actual defects in the group are potentially random defects if the number of the actual defects in the group is not greater than the number of the randomly generated defects in the group.

13. A system configured to determine if actual defects are potentially systematic defects or potentially random defects, comprising:
    an inspection system configured to detect actual defects on a wafer; and
    a computer system configured to:
        compare a number of the actual defects in a group to a number of randomly generated defects in a group, wherein a portion of a design on the wafer proximate a location of each of the actual defects in the group and each of the randomly generated defects in the group is substantially the same; and
        determine if the actual defects in the group are potentially systematic defects or potentially random defects based on results of the comparison, wherein determining if the actual defects in the group are potentially systematic defects or potentially random defects comprises determining that the actual defects in the group are potentially systematic defects if the number of the actual defects in the group is greater than the number of the randomly generated defects in the group and determining that the actual defects in the group are potentially random defects if the number of the actual defects in the group is not greater than the number of the randomly generated defects in the group.

* * * * *